(12) United States Patent
Sato et al.

(10) Patent No.: US 12,024,624 B2
(45) Date of Patent: Jul. 2, 2024

(54) MALEIMIDE RESIN COMPOSITION, PREPREG, LAMINATED BOARD, RESIN FILM, PRINTED WIRING BOARD, AND SEMICONDUCTOR PACKAGE

(71) Applicant: Resonac Corporation, Tokyo (JP)

(72) Inventors: Naoyoshi Sato, Tokyo (JP); Shuji Gozu, Tokyo (JP); Minoru Kakitani, Tokyo (JP); Takao Tanigawa, Tokyo (JP); Ryuji Akebi, Tokyo (JP); Chihiro Hayashi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 18/036,784

(22) PCT Filed: Nov. 16, 2021

(86) PCT No.: PCT/JP2021/041984
§ 371 (c)(1),
(2) Date: May 12, 2023

(87) PCT Pub. No.: WO2022/102781
PCT Pub. Date: May 19, 2022

(65) Prior Publication Data
US 2023/0392001 A1 Dec. 7, 2023

(30) Foreign Application Priority Data
Nov. 16, 2020 (JP) .................. 2020-190378

(51) Int. Cl.
| | |
|---|---|
| *B32B 3/10* | (2006.01) |
| *C08J 5/18* | (2006.01) |
| *C08J 5/24* | (2006.01) |
| *C08L 35/00* | (2006.01) |
| *H01L 23/14* | (2006.01) |

(52) U.S. Cl.
CPC .................. *C08L 35/00* (2013.01); *C08J 5/18* (2013.01); *C08J 5/24* (2013.01); *H01L 23/145* (2013.01); *C08J 2335/00* (2013.01); *C08J 2347/00* (2013.01); *C08J 2353/02* (2013.01); *C08L 2203/20* (2013.01); *C08L 2205/03* (2013.01)

(58) Field of Classification Search
None
See application file for complete search history.

(56) References Cited

U.S. PATENT DOCUMENTS

2018/0002485 A1\* 1/2018 Tanigawa ............... B32B 27/34

FOREIGN PATENT DOCUMENTS

| EP | 3992239 A1 | 5/2022 |
|---|---|---|
| JP | 56-55449 A | 5/1981 |
| JP | S62-127310 A | 6/1987 |
| JP | 2008-133454 A | 6/2008 |
| JP | 2009-35710 A | 2/2009 |
| JP | 2016-196549 A | 11/2016 |
| JP | 2016-204639 A | 12/2016 |
| JP | 2018-12747 A | 1/2018 |
| WO | 2014/181456 A1 | 11/2014 |
| WO | 2020/217678 A1 | 10/2020 |

\* cited by examiner

*Primary Examiner* — Christopher M Polley
(74) *Attorney, Agent, or Firm* — FITCH, EVEN, TABIN & FLANNERY, LLP

(57) ABSTRACT

The present invention relates to a maleimide resin composition containing (A) one or more selected from the group consisting of a maleimide compound having one or more N-substituted maleimide groups and a derivative thereof; and (B) a polymer having a hydrocarbon chain or a polyether chain in a main chain thereof, wherein the component (A) contains (A1) a maleimide compound having one or more N-substituted maleimide groups and a molecular weight of less than 600 and (A2) a maleimide compound having one or more N-substituted maleimide groups and a molecular weight of 600 or more. The present invention also relates to a prepreg, a laminated board, a resin film, a printed wiring board, and a semiconductor package that are obtained by using the maleimide resin composition.

13 Claims, No Drawings

MALEIMIDE RESIN COMPOSITION, PREPREG, LAMINATED BOARD, RESIN FILM, PRINTED WIRING BOARD, AND SEMICONDUCTOR PACKAGE

CROSS-REFERENCE TO RELATED APPLICATIONS

This application is a U.S. national phase application filed under 35 U.S.C. § 371 of International Application No. PCT/JP2021/041984, filed Nov. 16, 2021, designating the United States, which claims priority from Japanese Application No. 2020-190378, filed Nov. 16, 2020, which are incorporated herein by reference in their entireties.

TECHNICAL FIELD

The present embodiment relates to a maleimide resin composition, a prepreg, a laminated board, a resin film, a printed wiring board, and a semiconductor package.

BACKGROUND ART

In mobile communication devices such as mobile phones, base stations thereof, network infrastructure devices such as servers and routers, and electronic devices such as large computers, the speed and capacity of signals used are increasing year by year. Along with this, substrate materials for printed wiring boards mounted in these electronic devices are required to have dielectric characteristics [hereinafter sometimes referred to as "high-frequency characteristics".] capable of reducing transmission loss of high-frequency signals, that is, a low dielectric constant and a low dielectric loss tangent.

In recent years, in addition to the electronic devices mentioned above, new systems that handle high-frequency wireless signals have been put to practical use or planned for practical use in the field of ITS, such as those related to automobiles and transportation systems, and in the field of indoor short-distance communication. Therefore, it is expected that there will be an increasing need for substrate materials with excellent high-frequency characteristics for printed wiring boards used in these fields in the future.

Printed wiring boards are first required to have heat resistance and low thermal expansion that can withstand an environment in which they are used. Therefore, resins having excellent mechanical characteristics, such as maleimide compounds, have been used for printed wiring boards. However, since many of these resins having excellent mechanical characteristics contain polar groups, there is room for improvement in the high-frequency characteristics.

Therefore, low-polarity polymers with excellent high-frequency characteristics, such as polyphenylene ether and polybutadiene, have been used for printed wiring boards that require a high degree of low transmission loss. However, while these low-polarity polymers are effective in reducing the dielectric loss tangent, the low-polarity polymers have problems of low heat resistance, high coefficient of thermal expansion compared to metals, and poor mechanical characteristics.

As a method of improving the compatibility of low-polarity polymers, methods of modifying low-polarity polymers have been investigated. PTL 1 discloses a thermosetting resin composition containing a polybutadiene-based elastomer modified with an inorganic filler, a polyimide compound and an acid anhydride.

CITATION LIST

Patent Literature

PTL 1: JP 2018-012747 A

SUMMARY OF INVENTION

Technical Problem

In the thermosetting resin composition described in PTL 1, the compatibility between the polyimide compound and the polybutadiene-based elastomer is improved by modifying the polybutadiene-based elastomer with an acid anhydride.

By the way, in recent years, substrate materials are required to be applied to fifth-generation mobile communication system (5G) antennas that use radio waves in the frequency band exceeding 6 GHz and millimeter wave radars that use radio waves in the frequency band of 30 to 300 GHz. For this purpose, it is necessary to develop a resin composition having good circuit embedding properties and moldability while further improving dielectric characteristics in a band of 10 GHz or higher. A method of reducing the minimum melt viscosity of the resin composition is effective in obtaining good circuit embedding properties and moldability.

However, with the technique of PTL 1, it was difficult to reduce the minimum melt viscosity and achieve improvements in circuit embedding properties and moldability while maintaining good properties.

In view of the current situation, an object of the present embodiment is to provide a maleimide resin composition capable of reducing the minimum melt viscosity while having excellent dielectric characteristics in a high frequency band of 10 GHz or higher, and a prepreg, a laminated board, a resin film, a multilayer printed wiring board, and a semiconductor package using the maleimide resin composition.

Solution to Problem

The present inventors conducted studies to solve the aforementioned problems, and as a result, it has been found that the problems can be solved by the following embodiments [1] to [14].

[1] A maleimide resin composition containing
(A) one or more selected from the group consisting of a maleimide compound having one or more N-substituted maleimide groups and a derivative thereof, and
(B) a polymer having a hydrocarbon chain or a polyether chain in a main chain thereof, wherein the component (A) contains
(A1) a maleimide compound having one or more N-substituted maleimide groups and a molecular weight of less than 600, and
(A2) a maleimide compound having one or more N-substituted maleimide groups and a molecular weight of 600 or more.
[2] The maleimide resin composition according to the above [1], wherein the component (A1) is an aromatic bismaleimide compound.
[3] The maleimide resin composition according to the above [1] or [2], wherein the component (A2) is a maleimide compound containing an alicyclic hydrocarbon group.

[4] The maleimide resin composition according to the above [3], wherein the alicyclic hydrocarbon group is contained as part of an indane ring.
[5] The maleimide resin composition according to any one of the above [1] to [4], wherein the component (B) is a polymer having a hydrocarbon chain in a main chain thereof.
[6] The maleimide resin composition according to any one of the above [1] to [5], wherein the component (B) is (B1) a modified conjugated diene polymer obtained by modifying (b1) a conjugated diene polymer having a vinyl group in a side chain thereof with (b2) a maleimide compound having two or more N-substituted maleimide groups.
[7] The maleimide resin composition according to the above [6], wherein the component (B1) has, on a side chain thereof, a substituent obtained by reacting the vinyl group of the component (b1) with the N-substituted maleimide group of the component (b2).
[8] The maleimide resin composition according to the above [6] or [7], wherein the component (b1) is polybutadiene having a 1,2-vinyl group.
[9] The maleimide resin composition according to any one of the above [1] to [8], wherein a content ratio of the component (A) and the component (B) [(A)/(B)] is 0.3 to 3.0 on a mass basis.
[10] A prepreg containing the maleimide resin composition according to any one of the above [1] to [9].
[11] A laminated board containing the prepreg according to the above [10] and a metal foil.
[12] A resin film containing the maleimide resin composition according to any one of the above [1] to [9].
[13] A multilayer printed wiring board containing one or more selected from the group consisting of the prepreg according to the above [10], the laminated board according to the above [11], and the resin film according to the above [12].
[14] A semiconductor package in which a semiconductor element is mounted on the multilayer printed wiring board according to the above [13].

Advantageous Effects of Invention

According to the present embodiment, it is possible to provide a maleimide resin composition capable of reducing the minimum melt viscosity while having excellent dielectric characteristics in a high frequency band of 10 GHz or higher, and a prepreg, a laminated board, a resin film, a multilayer printed wiring board, and a semiconductor package using the maleimide resin composition.

DESCRIPTION OF EMBODIMENTS

In the present specification, a numerical value range expressed using "to" indicates a range including the numerical values before and after "to" as the minimum and maximum values, respectively.

A lower limit and an upper limit of a numerical value range described in the present specification can be arbitrarily combined with lower and upper limits of other numerical value ranges, respectively.

In the numerical value ranges described in the present specification, the upper limit or lower limit of a numerical value range may be replaced with values shown in the Examples.

Each component and material exemplified in the present specification may be used alone or in combination of two or more thereof unless otherwise specified.

In the present specification, unless otherwise specified, the content of each component in the resin composition means, when there are a plurality of substances corresponding to each component in the resin composition, the total amount of the plurality of substances present in the resin composition.

Aspects in which the items described in the present specification are arbitrarily combined are also included in the present embodiment.

The mechanism of action described in the present specification is an assumption, and does not limit the mechanism of the effect of the resin composition according to the present embodiment.

The term "compatible" used herein means that the resins are miscible with each other on a nano- or micro-unit, or in appearance, even if the resins are not necessarily compatible on a molecular basis.

The term "semi-cured product" used herein is synonymous with a resin composition in the state of B-stage according to JIS K 6800 (1985), and the term "cured product" is synonymous with a resin composition in the state of C-stage according to JIS K 6800 (1985).

The number average molecular weight in the present specification means a value measured in terms of polystyrene by gel permeation chromatography (GPC), and can be specifically measured by a method described in the Examples.

[Maleimide Resin Composition]

The maleimide resin composition of the present embodiment [hereinafter sometimes simply referred to as the "resin composition".] contains (A) one or more selected from the group consisting of a maleimide compound having one or more N-substituted maleimide groups and a derivative thereof [hereinafter sometimes referred to as "(A) a maleimide compound or a derivative thereof" or "component (A)".], and (B) a polymer having a hydrocarbon chain or a polyether chain in a main chain thereof [hereinafter sometimes referred to as "component (B)".], wherein the component (A) contains (A1) a maleimide compound having one or more N-substituted maleimide groups and a molecular weight of less than 600 [hereinafter sometimes referred to as "maleimide compound (A1)" or "component (A1)".], and (A2) a maleimide compound having one or more N-substituted maleimide groups and a molecular weight of 600 or more [hereinafter sometimes referred to as "maleimide compound (A2)" or "component (A2)".].

The reason why the maleimide resin composition of the present embodiment can reduce the minimum melt viscosity while having excellent dielectric characteristics in a high frequency band of 10 GHz or higher is not clear, but is presumed as follows.

A maleimide compound with a high molecular weight has low crystallinity, and thus the maleimide compound has excellent solvent solubility and compatibility with other resins while it has poor resin flowability due to its high viscosity. On the other hand, a maleimide compound with a low molecular weight has high crystallinity, and thus the maleimide compound is inferior in solvent solubility and compatibility with other resins while it has excellent resin flowability due to its low viscosity. In contrast, the maleimide resin composition of the present embodiment uses a maleimide compound with a high molecular weight and a maleimide compound with a low molecular weight in combination to achieve a reduced minimum melt viscosity without impairing the solvent solubility and compatibility with other resins. This makes the maleimide resin composition of the present embodiment excellent in circuit embedding properties and moldability.

Furthermore, the resin composition not only has excellent compatibility, but also has excellent heat resistance and low thermal expansion, with an unexpectedly reduced dielectric loss tangent. This is presumed to be due to the fact that the improvement in compatibility sufficiently exhibited the effect of reducing the dielectric loss tangent derived from the component (B) and the excellent mechanical characteristics derived from the (A) maleimide compound or a derivative thereof.

Each component of the resin composition of the present embodiment will be described in detail below.

<(A) Maleimide Compound or Derivative thereof>

The component (A) is one or more selected from the group consisting of a maleimide compound having one or more N-substituted maleimide groups and a derivative thereof, and contains (A1) a maleimide compound having one or more N-substituted maleimide groups and a molecular weight of less than 600, and (A2) a maleimide compound having one or more N-substituted maleimide groups and a molecular weight of 600 or more.

Examples of the aforementioned "derivative of a maleimide compound having one or more N-substituted maleimide groups" include an addition reaction product of a maleimide compound having one or more N-substituted maleimide groups and a diamine compound (a2), which will be described later.

The component (A) may be used alone or in combination of two or more thereof.

The component (A) is preferably one or more compounds selected from the group consisting of the following (i) and (ii) from the viewpoint of compatibility with other resins, dielectric characteristics, and adhesion to a conductor.

(i) A maleimide compound (a1) having one or more N-substituted maleimide groups [hereinafter sometimes referred to as "maleimide compound (a1)" or "component (a1)".]

(ii) An aminomaleimide compound having a structural unit derived from the maleimide compound (a1) and a structural unit derived from the diamine compound (a2) [hereinafter sometimes referred to as "aminomaleimide compound (AX)" or "component (AX)".]

(Maleimide Compound (a1) Having One or More N-substituted Maleimide Groups)

The component (a1) is not particularly limited as long as it is a maleimide compound having one or more N-substituted maleimide groups, and examples thereof include a maleimide compound containing one or more selected from the group consisting of a chain hydrocarbon group, an alicyclic hydrocarbon group and an aromatic hydrocarbon group.

Of these, from the viewpoint of compatibility with other resins, dielectric characteristics, heat resistance, low thermal expansion and mechanical characteristics, it preferably contains a maleimide compound containing an alicyclic hydrocarbon group, a maleimide compound having a biphenylaralkyl skeleton, and more preferably contains a maleimide compound containing an alicyclic hydrocarbon group.

The component (a1) may be used alone or in combination of two or more thereof.

As the maleimide compound containing an alicyclic hydrocarbon group, a maleimide compound containing an alicyclic hydrocarbon group as part of a condensed ring of an aromatic ring and an aliphatic ring is preferable.

The condensed ring preferably has a condensed bicyclic structure, more preferably an indane ring, from the viewpoints of compatibility with other resins, dielectric characteristics, adhesion to a conductor, and ease of production.

That is, the maleimide compound containing an alicyclic hydrocarbon group preferably contains an indane ring and contains the alicyclic hydrocarbon group as part of the indane ring.

In the present specification, an indane ring means a condensed bicyclic structure of an aromatic 6-membered ring and a saturated aliphatic 5-membered ring. At least one carbon atom of ring carbon atoms forming the indane ring has a bonding group for bonding to another group constituting the component (a1). The ring carbon atom having the bonding group and other ring carbon atoms may or may not have a substituent other than the aforementioned bonding group.

In the component (a1), the indane ring is preferably contained as a divalent group represented by the following general formula (a1-1).

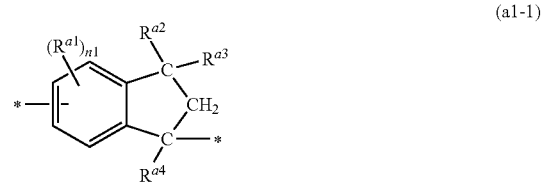

(a1-1)

(In the formula, $R^{a1}$ is an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a hydroxy group or a mercapto group, and n1 is an integer of 0 to 3. $R^{a2}$ to $R^{a4}$ each are independently an alkyl group having 1 to 10 carbon atoms. * represents a bonding site.)

Examples of the alkyl group having 1 to 10 carbon atoms represented by $R^{a1}$ in the above general formula (a1-1) include a methyl group, an ethyl group, a propyl group, a butyl group, a pentyl group, a hexyl group, a heptyl group, an octyl group, and a decyl group. These alkyl groups may be linear or branched.

Examples of the alkyl group included in the alkyloxy group having 1 to 10 carbon atoms and the alkylthio group having 1 to 10 carbon atoms represented by $R^{a1}$ include the same alkyl groups having 1 to 10 carbon atoms as described above.

Examples of the aryl group having 6 to 10 carbon atoms represented by $R^{a1}$ include a phenyl group and a naphthyl group.

Examples of the aryl group contained in the aryloxy group having 6 to 10 carbon atoms and the arylthio group having 6 to 10 carbon atoms represented by $R^{a1}$ include the same aryl groups having 6 to 10 carbon atoms as described above.

Examples of the cycloalkyl group having 3 to 10 carbon atoms represented by $R^{a1}$ include a cyclopropyl group, a cyclobutyl group, a cyclopentyl group, a cyclohexyl group, a cycloheptyl group, a cyclooctyl group, and a cyclodecyl group.

When n1 in the general formula (a1-1) is an integer of 1 to 3, $R^{a1}$ is preferably an alkyl group having 1 to 4 carbon atoms, a cycloalkyl group having 3 to 6 carbon atoms, and an aryl group having 6 to 10 carbon atoms, more preferably an alkyl group having 1 to 4 carbon atoms, from the viewpoint of solvent solubility and reactivity.

Examples of the alkyl groups having 1 to 10 carbon atoms represented by $R^{a2}$ to $R^{a4}$ include a methyl group, an ethyl group, a propyl group, a butyl group, a pentyl group, a hexyl group, a heptyl group, an octyl group and a decyl group. These alkyl groups may be linear or branched. Of these, $R^{a2}$ to $R^{a4}$ are preferably an alkyl group having 1 to 4 carbon atoms, more preferably a methyl group or an ethyl group, and still more preferably a methyl group.

In the general formula (a1-1), n1 is an integer of 0 to 3, and when n1 is 2 or 3, the plurality of $R^{a1}$'s may be the same or different.

Of the above, from the viewpoint of compatibility with other resins, dielectric characteristics, adhesion to a conductor, and ease of production, the divalent group represented by the general formula (a1-1) is preferably a divalent group represented by the following formula (a1-1'), wherein n1 is 0 and $R^{a2}$ to $R^{a4}$ are methyl groups.

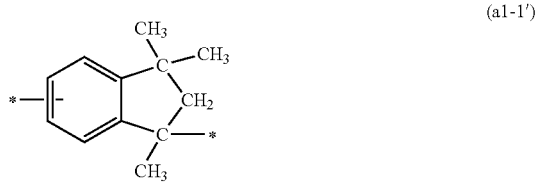

(a1-1')

(In the Formula, * Represents a Bonding Site.)

The component (a1) containing a divalent group represented by the general formula (a1-1) is preferably represented by the following general formula (a1-2) from the viewpoint of compatibility with other resins, dielectric characteristics, and ease of production.

when n3 is greater than 1, the plurality of $R^{a2}$'s, the plurality of $R^{a3}$'s, and the plurality of $R^{a4}$'s may be the same or different, respectively.

The description of the alkyl group having 1 to 10 carbon atoms, the alkyloxy group having 1 to 10 carbon atoms, the alkylthio group having 1 to 10 carbon atoms, the aryl group having 6 to 10 carbon atoms, the aryloxy group having 6 to 10 carbon atoms, the arylthio group having 6 to 10 carbon atoms, and the cycloalkyl group having 3 to 10 carbon atoms represented by $R^{a5}$ in the general formula (a1-2) is the same as the description of the alkyl group having 1 to 10 carbon atoms, the alkyloxy group having 1 to 10 carbon atoms, the alkylthio group having 1 to 10 carbon atoms, the aryl group having 6 to 10 carbon atoms, the aryloxy group having 6 to 10 carbon atoms, the arylthio group having 6 to 10 carbon atoms, and the cycloalkyl group having 3 to 10 carbon atoms represented by $R^{a1}$ above.

Of these, $R^{a5}$ is preferably an alkyl group having 1 to 4 carbon atoms, a cycloalkyl group having 3 to 6 carbon atoms, and an aryl group having 6 to 10 carbon atoms, more preferably an alkyl group having 1 to 3 carbon atoms, from the viewpoint of compatibility with other resins, dielectric characteristics, adhesion to a conductor, and ease of production.

In the general formula (a1-2), n2 is an integer of 0 to 4, and from the viewpoint of compatibility with other resins, dielectric characteristics, adhesion to a conductor, and ease of production, is preferably an integer of 0 to 3, more preferably 0 or 2.

When n2 is 1 or more, the benzene ring and the N-substituted maleimide group have a twisted conformation,

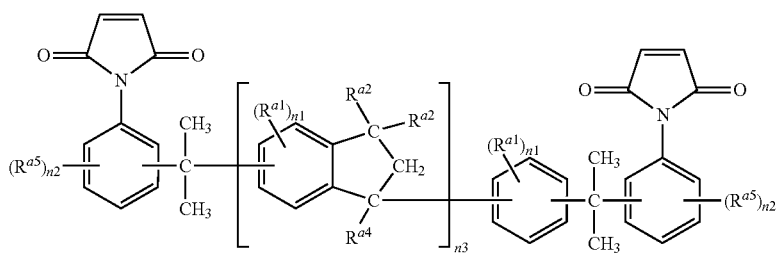

(a1-2)

(In the formula, $R^{a1}$ to $R^{a4}$ and n1 are the same as in the general formula (a1-1) above. $R^{a5}$'s each are independently an alkyl group having 1 to 10 carbon atoms, an alkyloxy group having 1 to 10 carbon atoms, an alkylthio group having 1 to 10 carbon atoms, an aryl group having 6 to 10 carbon atoms, an aryloxy group having 6 to 10 carbon atoms, an arylthio group having 6 to 10 carbon atoms, a cycloalkyl group having 3 to 10 carbon atoms, a halogen atom, a nitro group, a hydroxy group or a mercapto group, n2's each are independently an integer of 0 to 4, and n3 is a numerical value of 0.95 to 10.0.)

In the above general formula (a1-2), the plurality of $R^{a1}$'s, the plurality of n1's, the plurality of $R^{a5}$'s, and the plurality of n2's may be the same or different, respectively. Further, which tends to further improve solvent solubility by suppressing intermolecular stacking. From the same point of view, when n2 is 1 or more, the substitution position of $R^{a5}$ is preferably ortho to the N-substituted maleimide group.

In the general formula (a1-2), n3 is preferably 0.98 to 8.0, more preferably 1.0 to 7.0, and still more preferably 1.1 to 6.0, from the viewpoint of compatibility with other resins, solvent solubility, melt viscosity, handling properties and heat resistance.

The component (a1) represented by the general formula (a1-2) is more preferably represented by the following general formula (a1-3) or the following general formula (a1-4).

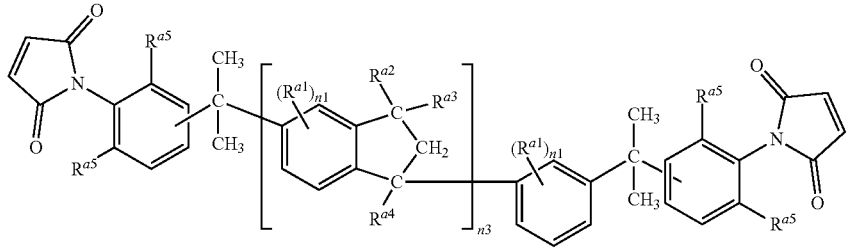
(a1-3)

(In the formula, $R^{a1}$ to $R^{a5}$, n1, and n3 are the same as in the general formula (a1-2).)

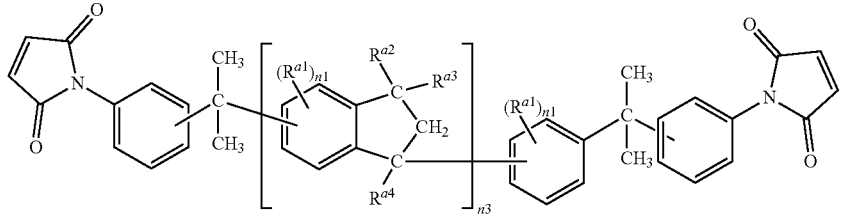
(a1-4)

(In the formula, $R^{a1}$ to $R^{a4}$, n1, and n3 are the same as in the general formula (a1-2).)

Examples of the component (a1) represented by the general formula (a1-3) include a compound represented by the following general formula (a1-3-1), a compound represented by the following general formula (a1-3-2), and a compound represented by the following general formula (a1-3-3).

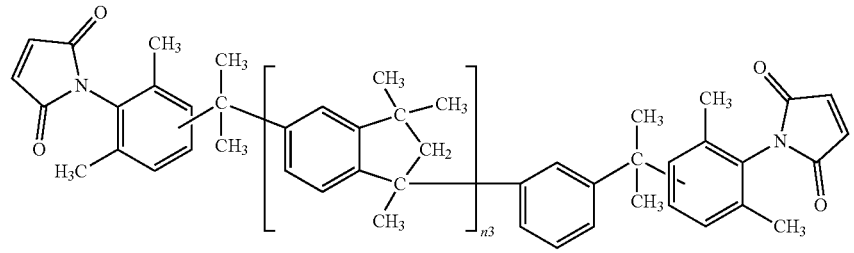
(a1-3-1)

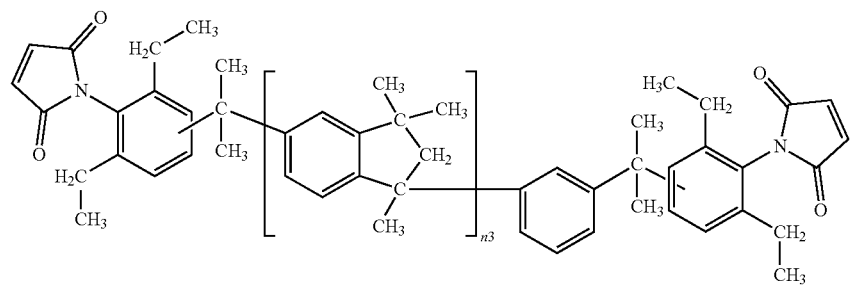
(a1-3-2)

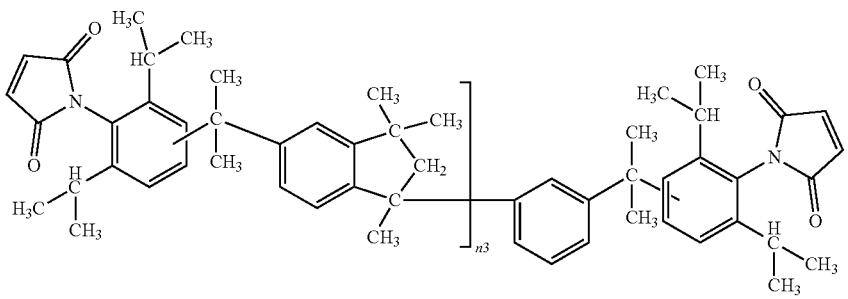

(a1-3-3)

(In the formula, n3 is the same as in the general formula (a1-2).)

The compound represented by the general formula (a1-4) is more preferably represented by the following general formula (a1-4-1) from the viewpoint of compatibility, solvent solubility, melt viscosity, handling properties and heat resistance.

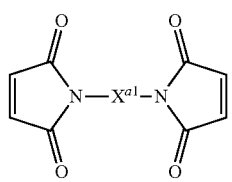

(a1-11)

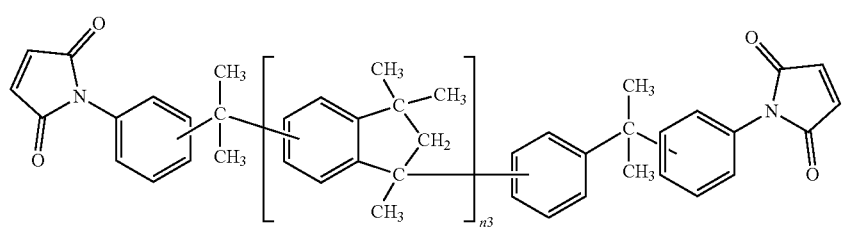

(a1-4-1)

(In the formula, n3 is the same as in the general formula (a1-2).)

Examples of the maleimide compound having a biphenylaralkyl skeleton include a maleimide compound represented by the following general formula (a1-5).

(In the formula, $X^{a1}$ is a divalent group represented by the following general formula (a1-12), the following general formula (a1-13), the following general formula (a1-14), or the following general formula (a1-15), provided that these groups do not include an alicyclic hydrocarbon group.)

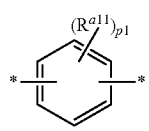

(a1-12)

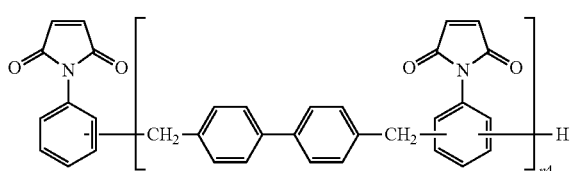

(a1-5)

(n4 is an integer of 1 to 5.)

Examples of a component (a1) other than a maleimide compound containing an alicyclic hydrocarbon group and a maleimide compound having a biphenylaralkyl skeleton [hereinafter sometimes referred to as "other maleimide compounds".] includes a maleimide compound represented by the following general formula (a1-11).

(In the formula, $R^{a11}$ is an aliphatic hydrocarbon group having 1 to 5 carbon atoms or a halogen atom; p1 is an integer of 0 to 4; * represents a bonding site.)

Examples of the aliphatic hydrocarbon group having 1 to 5 carbon atoms represented by $R^{a11}$ include a methyl group, an ethyl group, an n-propyl group, an isopropyl group, an n-butyl group, an isobutyl group, a t-butyl group, and an n-pentyl group. The aliphatic hydrocarbon group is preferably an aliphatic hydrocarbon group having 1 to 3 carbon atoms, more preferably an alkyl group having 1 to 3 carbon atoms, and even more preferably a methyl group.

Examples of the halogen atom includes a fluorine atom, a chlorine atom, a bromine atom, and an iodine atom.

p1 is an integer of 0 to 4, and from the viewpoint of availability, is preferably an integer of 0 to 2, more preferably 0 or 1, and still more preferably 0. When p1 is an integer of 2 or more, the plurality of $R^{a11}$'s may be the same or different.

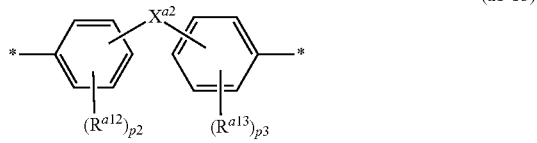

(a1-13)

(In the formula, $R^{a12}$ and $R^{a13}$ each are independently an aliphatic hydrocarbon group having 1 to 5 carbon atoms or a halogen atom. $X^{a2}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a divalent group represented by the following general formula (a1-13-1); p2 and p3 each are independently an integer of 0 to 4; * represents a bonding site.)

The aliphatic hydrocarbon group having 1 to 5 carbon atoms and the halogen atom represented by $R^{a12}$ and $R^{a13}$ are explained in the same manner as for $R^{a11}$. The aliphatic hydrocarbon group is preferably an aliphatic hydrocarbon group having 1 to 3 carbon atoms, more preferably a methyl group or an ethyl group, and still more preferably an ethyl group.

Examples of the alkylene group having 1 to 5 carbon atoms represented by $X^{a2}$ include a methylene group, a 1,2-dimethylene group, a 1,3-trimethylene group, a 1,4-tetramethylene group, and a 1,5-pentamethylene group. From the viewpoint of compatibility with other resins, adhesion to a conductor, heat resistance, low thermal expansion and mechanical characteristics, the alkylene group is preferably an alkylene group having 1 to 3 carbon atoms, more preferably an alkylene group having 1 or 2 carbon atoms, and still more preferably a methylene group.

Examples of the alkylidene group having 2 to 5 carbon atoms represented by $X^{a2}$ include an ethylidene group, a propylidene group, an isopropylidene group, a butylidene group, an isobutylidene group, a pentylidene group, and an isopentylidene group. Of these, an isopropylidene group is preferable from the viewpoint of compatibility with other resins, adhesion to a conductor, heat resistance, low thermal expansion, and mechanical characteristics.

p2 and p3 each are independently an integer of 0 to 4, and from the viewpoint of availability, both of p2 and p3 are preferably integers of 0 to 3, more preferably integers of 0 to 2, and still more preferably 0 or 2. When p2 or p3 is an integer of 2 or more, the plurality of $R^{a12}$'s or $R^{a13}$'s may be the same or different, respectively.

The divalent group represented by the general formula (a1-13-1) represented by $X^{a2}$ is as follows.

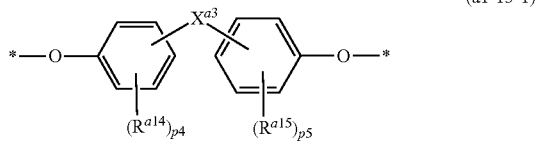

(a1-13-1)

(In the formula, $R^{a14}$ and $R^{a15}$ each are independently an aliphatic hydrocarbon group having 1 to 5 carbon atoms or a halogen atom. $X^{a3}$ is an alkylene group having 1 to 5 carbon atoms, an alkylidene group having 2 to 5 carbon atoms, an ether group, a sulfide group, a sulfonyl group, a carbonyloxy group, a keto group, or a single bond; p4 and p5 each are independently an integer of 0 to 4; * represents a bonding site.)

The aliphatic hydrocarbon group having 1 to 5 carbon atoms and the halogen atom represented by $R^{a14}$ and $R^{a15}$ are explained in the same manner as for $R^{a11}$.

Examples of the alkylene group having 1 to 5 carbon atoms and the alkylidene group having 2 to 5 carbon atoms represented by $X^{a3}$ include the same groups as those for the alkylene group having 1 to 5 carbon atoms and the alkylidene group having 2 to 5 carbon atoms represented by $X^{a2}$.

Of the above options, $X^{a3}$ is preferably an alkylidene group having 2 to 5 carbon atoms, more preferably an alkylidene group having 2 to 4 carbon atoms, and still more preferably an isopropylidene group.

p4 and p5 each are independently an integer of 0 to 4, and from the viewpoint of availability, both of p4 and p5 are preferably integers of 0 to 2, more preferably 0 or 1, and still more preferably 0. When p4 or p5 is an integer of 2 or more, the plurality of $R^{a14}$'s or $R^{a15}$'s may be the same or different, respectively.

Of the above options, $X^{a2}$ is preferably an alkylene group having 1 to 5 carbon atoms, an alkylidene group having 2 to 5 carbon atoms, or a divalent group represented by the above general formula (a1-13-1).

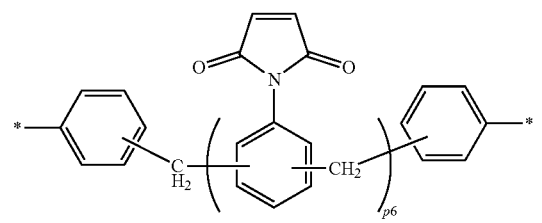

(a1-14)

(In the formula, p6 is an integer of 0 to 10. * represents a bonding site.)

p6 is preferably an integer of 0 to 5, more preferably an integer of 0 to 4, and still more preferably an integer of 0 to 3, from the viewpoint of availability.

(a1-15)

(In the formula, $R^{a16}$ and $R^{a17}$ each are independently a hydrogen atom or an aliphatic hydrocarbon group having 1 to 5 carbon atoms; p7 is an integer of 1 to 8; * represents a bonding site.)

The aliphatic hydrocarbon group having 1 to 5 carbon atoms represented by $R^{a16}$ and $R^{a17}$ is explained in the same manner as for $R^{a11}$.

p7 is an integer of 1 to 8, preferably an integer of 1 to 5, more preferably an integer of 1 to 3, and still more preferably 1.

When p7 is an integer of 2 or more, the plurality of $R^{a16}$'s or $R^{a17}$'s may be the same or different, respectively.

Specific examples of other maleimide compounds include an aromatic bismaleimide compound having two N-substituted maleimide groups bonded to an aromatic ring in the molecule, such as 4,4'-diphenylmethanebismaleimide, bis(4-maleimidophenyl)ether, bis(4-maleimidophenyl)sulfone, 3,3'-dimethyl-5,5'-diethyl -4,4'-diphenylmethanebismaleimide, 4-methyl-1,3-phenylenebismaleimide, m-phenylenebismaleimide, and 2,2-bis[4-(4-maleimidophenoxy)phenyl] propane; an aromatic polymaleimide compound having three or more N-substituted maleimide groups bonded to an aromatic ring in the molecule, such as polyphenylmethane maleimide; and an aliphatic maleimide compound having an N-substituted maleimide group bonded to an aliphatic hydrocarbon group in the molecule, such as 1,6-bismaleimide-(2,2,4-trimethyl)hexane and pyrophosphate binder type long-chain alkylbismaleimide.

(Aminomaleimide Compound (AX))

The component (AX) is an aminomaleimide compound having a structural unit derived from the maleimide compound (a1) and a structural unit derived from the diamine compound (a2).

The component (AX) may be used alone or in combination of two or more thereof.

[Structural Unit Derived from Maleimide Compound (a1)]

Examples of the structural unit derived from the component (a1) include a structural unit obtained by the Michael addition reaction of at least one N-substituted maleimide group among the N-substituted maleimide groups of the component (a1) with the amino group of the diamine compound (a2).

The structural unit derived from the component (a1) contained in the component (AX) may be of one kind alone, or may be of two or more kinds thereof.

The content of the structural unit derived from the component (a1) in the aminomaleimide compound (AX) is not particularly limited; however, it is preferably 5 to 95% by mass, more preferably 30 to 93% by mass, still more preferably 60 to 90% by mass, and particularly preferably 75 to 90% by mass. When the content of the structural unit derived from the component (a1) is within the aforementioned range, the dielectric characteristics and film handling properties tend to be further improved.

[Structural Unit Derived from Diamine Compound (a2)]

Examples of the structural unit derived from the component (a2) include a structural unit obtained by the Michael addition reaction of one or both of the two amino groups of the component (a2) with the N-substituted maleimide group of the maleimide compound (a1).

The structural unit derived from the component (a2) contained in the component (AX) may be of one kind alone, or may be of two or more kinds thereof.

The amino group of the component (a2) is preferably a primary amino group.

Examples of the structural unit derived from the diamine compound having two primary amino groups include a group represented by the following general formula (a2-1) and a group represented by the following general formula (a2-2).

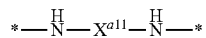

(a2-1)

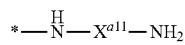

(a2-2)

In the formula, $X^{a11}$ is a divalent organic group, and * indicates a bonding position to another structure.)

$X^{a11}$ in the above general formulas (a2-1) and (a2-2) is a divalent organic group and corresponds to a divalent group obtained by removing two amino groups from the component (a2).

$X^{a11}$ in the above general formulas (a2-1) and (a2-2) is preferably a divalent group represented by the following general formula (a2-3).

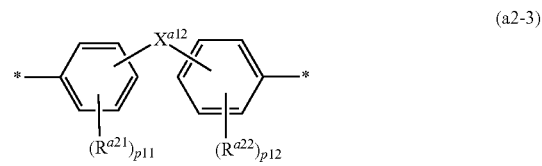

(a2-3)

(In the formula, $R^{a21}$ and $R^{a22}$ each are independently an aliphatic hydrocarbon group having 1 to 5 carbon atoms, an alkoxy group having 1 to 5 carbon atoms, a hydroxy group, or a halogen atom. $X^{a12}$ is a an alkylene group, having 1 to 5 carbon atoms, an alkylidene group having 2 to 5 carbon atoms, an ether group, a sulfide group, a sulfonyl group, a carbonyloxy group, a keto group, a fluorenylene group, a single bond, or a divalent group represented by the following general formula (a2-3-1) or (a2-3-2); p11 and p12 each are independently an integer of 0 to 4; * represents a bonding site.)

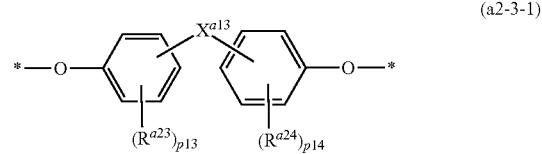

(a2-3-1)

(In the formula, $R^{a23}$ and $R^{a24}$ each are independently an aliphatic hydrocarbon group having 1 to 5 carbon atoms or a halogen atom. $X^{a13}$ is an alkylene group having 1 to 5 carbon atoms, an alkylidene group having 2 to 5 carbon atoms, an m-phenylenediisopropylidene group, a p-phenylenediisopropylidene group, an ether group, a sulfide group, a sulfonyl group, a carbonyloxy group, a keto group or a single bond; p13 and p14 each are independently an integer of 0 to 4; * represents a bonding site.)

(a2-3-2)

(In the formula, $R^{a25}$ is an aliphatic hydrocarbon group having 1 to 5 carbon atoms or a halogen atom. $X^{a14}$ and $X^{a15}$ each are independently an alkylene group having 1 to 5 carbon atoms, an alkylidene group having 2 to 5 carbon atoms, an ether group, a sulfide group, a sulfonyl group, a carbonyloxy group, a keto group, or a single bond; p15 is an integer of 0 to 4; * represents a bonding site.)

Examples of the aliphatic hydrocarbon group having 1 to 5 carbon atoms or the halogen atom represented by $R^{a21}$, $R^{a22}$, $R^{a23}$, $R^{a24}$ and $R^{a25}$ in the above general formulas (a2-3), (a2-3-1) and (a2-3-2) include the same groups as those for $R^{a11}$ in the general formula (a1-12). The aliphatic hydrocarbon group is preferably an aliphatic hydrocarbon group having 1 to 3 carbon atoms, more preferably an alkyl group having 1 to 3 carbon atoms, and still more preferably a methyl group or an ethyl group. The alkylene group having 1 to 5 carbon atoms and the alkylidene group having 2 to 5 carbon atoms represented by $X^{a12}$ in the general formula (a2-3), $X^{a13}$ in the general formula (a2-3-1), and $X^{a14}$ and $X^{a15}$ in the general formula (a2-3-2) are described in the same manner as for $X^{a2}$ in the general formula (a1-13).

In the general formula (a2-3), p11 and p12 each are independently an integer of 0 to 4, and from the viewpoint of availability, both of p11 and p12 are preferably integers of 0 to 3, more preferably 0 to 2, and still more preferably 0 or 2.

When p11 and p12 are integers of 2 or more, the plurality of $R^{a2}$i's or $R^{a22}$'s may be the same or different, respectively.

In the general formula (a2-3-1), p13 and p14 each are independently an integer of 0 to 4, and from the viewpoint of availability, both of p13 and p14 are preferably integers of 0 to 2, more preferably 0 or 1, and still more preferably 0.

When p13 and p14 are integers of 2 or more, the plurality of $R^{a23}$'s or $R^{a24}$'s may be the same or different, respectively.

In the general formula (a2-3-2), p15 is an integer of 0 to 4, and from the viewpoint of availability, is preferably an integer of 0 to 2, more preferably 0 or 1, and still more preferably 0.

When p15 is an integer of 2 or more, the plurality of $R^{a25}$'s may be the same or different, respectively.

The content of the structural unit derived from the component (a2) in the aminomaleimide compound (AX) is not particularly limited; however, it is preferably 5 to 95% by mass, more preferably 7 to 70% by mass, still more preferably 10 to 40% by mass, and particularly preferably 10 to 25% by mass. When the content of the structural unit derived from the component (a2) is within the aforementioned range, the dielectric characteristics, heat resistance, flame retardancy and glass transition temperature tend to be further improved.

In the aminomaleimide compound (AX), the equivalent ratio of the total equivalent (Ta2) of groups derived from the —NH$_2$ group of the diamine compound (a2) (including —NH$_2$) and the total equivalent (Ta1) of groups derived from the N-substituted maleimide group of the maleimide compound (a1) (including the N-substituted maleimide group) (Ta2/Ta1) is not particularly limited; however, it is preferably 0.05 to 10, more preferably 0.5 to 7, and still more preferably 1 to 5. When the equivalent ratio (Ta2/Ta1) is within the aforementioned range, the dielectric characteristics, heat resistance, flame retardancy and glass transition temperature tend to be further improved.

The number average molecular weight of the aminomaleimide compound (AX) is not particularly limited; however, it is preferably 400 to 10,000, more preferably 500 to 5,000, still more preferably 600 to 2,000, and particularly preferably 700 to 1,500.

Specific examples of the component (a2) include 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3'-dimethyl-5,5'-diethyl-4,4'-diaminodiphenylmethane, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis[1-[4-(4-aminophenoxy)phenyl]-1-methylethyl]benzene, 1,4-bis[1-[4-(4-aminophenoxy)phenyl]-1-methylethyl]benzene, 4,4'-[1,3-phenylenebis(1-methylethylidene)]bisaniline, 4,4'-[1,4-phenylenebis(1-methylethylidene)]bisaniline, 3,3'-[1,3-phenylenebis(1-methylethylidene)]bisaniline, bis[4-(4-aminophenoxy)phenyl]sulfone, bis[4-(3-aminophenoxy)phenyl]sulfone, and 9,9-bis(4-aminophenyl)fluorene.

Of these, the component (a2) is preferably 4,4'-diaminodiphenylmethane, 4,4'-diamino-3,3'-dimethyldiphenylmethane, 4,4'-diamino-3,3'-diethyldiphenylmethane, 2,2-bis[4-(4-aminophenoxy)phenyl]propane, 4,4'-[1,3-phenylenebis(1-methylethylidene)]bisaniline and 4,4'-[1,4-phenylenebis(1-methylethylidene)]bisaniline from the viewpoint of excellent solubility in an organic solvent, reactivity with the maleimide compound (a1), and heat resistance. Further, the component (a2) is preferably 3,3'-dimethyl-5,5'-diethyl-4,4'-diaminodiphenylmethane from the viewpoint of excellent dielectric characteristics and low water absorption. In addition, the component (a2) is preferably 2,2-bis[4-(4-aminophenoxy)phenyl]propane from the viewpoint of excellent mechanical characteristics such as high adhesion to a conductor, elongation and breaking strength. Furthermore, from the viewpoint of excellent dielectric characteristics and low hygroscopicity in addition to excellent solubility in an organic solvent, reactivity at the time of synthesis, heat resistance, and high adhesion to a conductor, the component (a2) is preferably 4,4'-[1,3-phenylenebis(1-methylethylidene)]bisaniline and 4,4'-[1,4-phenylenebis(1-methylethylidene)]bisaniline.

(Method of Producing Aminomaleimide Compound (AX))

The component (AX) can be produced, for example, by reacting the maleimide compound (a1) with the diamine compound (a2) in an organic solvent.

By reacting the maleimide compound (a1) with the diamine compound (a2), the aminomaleimide compound (AX) is obtained through the Michael addition reaction between the maleimide compound (a1) and the diamine compound (a2).

A reaction catalyst may be used as necessary when reacting the maleimide compound (a1) and the diamine compound (a2).

Examples of the reaction catalyst include acidic catalysts such as p-toluenesulfonic acid; amines such as triethylamine, pyridine and tributylamine; imidazoles such as methylimidazole and phenylimidazole; and phosphorus catalysts such as triphenylphosphine.

The reaction catalyst may be used alone or in combination of two or more thereof.

In addition, the blending amount of the reaction catalyst is not particularly limited; however, it is, for example, 0.01 to 5 parts by mass based on 100 parts by mass of a total amount of the maleimide compound (a1) and the diamine compound (a2).

A reaction temperature for the above reaction is preferably 50 to 160° C. from the viewpoint of workability, such as a reaction rate, and gelation suppression at the time of the reaction, etc. Further, from the same viewpoint, a reaction time for the above reaction is preferably 1 to 10 hours.

Also, in this step, a solid content concentration of the reaction raw materials and a solution viscosity may be regulated by addition of an organic solvent or concentration.

Although the solid content concentration of the reaction raw materials is not particularly limited, for example, it is preferably 10 to 90% by mass, more preferably 15 to 85% by mass, and still more preferably 20 to 80% by mass. When the solid content concentration of the reaction raw materials is equal to or more than the aforementioned lower limit, an excellent reaction rate is obtained, and productivity tends to be further improved. In addition, when the solid content concentration of the reaction raw materials is equal to or less than the aforementioned upper limit, a better solubility is obtained, stirring efficiency is improved, and gelation tends to be more suppressed.

(Component (A1) and Component (A2))

As described above, the component (A) includes (A1) a maleimide compound having one or more N-substituted maleimide groups and a molecular weight of less than 600, and (A2) a maleimide compound having one or more N-substituted maleimide groups and a molecular weight of 600 or more.

In addition, the "molecular weight" of the component (A1) and the component (A2) in the present embodiment means, when the compound is not a polymer and when a structural formula of the compound can be specified, a molecular weight that can be calculated from the structural formula, and means, when the compound is a polymer, a number average molecular weight.

[Component (A1)]

Examples of the component (A1) include those having a molecular weight of less than 600 of those exemplified as the aforementioned maleimide compound (a1). Of these, an aromatic bismaleimide compound having a molecular weight of less than 600 is preferable, and an aromatic bismaleimide compound represented by the general formula (a1-11) having a molecular weight of less than 600 is more preferable.

In the present specification, an aromatic bismaleimide compound means a compound having two N-substituted maleimide groups directly bonded to an aromatic ring.

The component (A1) may be used alone or in combination of two or more thereof.

Specific examples of the component (A1) include 4,4'-diphenylmethanebismaleimide, bis(4-maleimidophenyl) ether, bis(4-maleimidophenyl)sulfone, 3,3'-dimethyl-5,5'-diethyl-4,4'-diphenylmethanebismaleimide, 4-methyl-1,3-phenylenebismaleimide, m-phenylenebismaleimide, and 2,2-bis[4-(4-maleimidophenoxy)phenyl]propane. Of these, 4,4'-diphenylmethanebismaleimide, 2,2-bis[4-(4-maleimidophenoxy)phenyl]propane, and 3,3'-dimethyl-5,5'-diethyl-4, 4'-diphenylmethanebismaleimide are preferred.

The molecular weight of the component (A1) is not particularly limited as long as it is in the range of less than 600, and can be determined according to the desired performance. For example, from the viewpoint of further improving the flowability of the resin and further reducing the minimum melt viscosity, the molecular weight of the component (A1) may be less than 550, or less than 500, or may be less than 450. Further, the lower limit of the molecular weight of the component (A1) may be 200 or more, or 300 or more.

[Component (A2)]

Examples of the component (A2) include those having a molecular weight of 600 or more of those exemplified as the maleimide compound (a1). Of these, a maleimide compound containing an alicyclic hydrocarbon group as described above is preferable, a maleimide compound containing an indane ring is more preferable, a maleimide compound represented by the general formula (a1-2) is still more preferable, and a maleimide compound represented by the general formula (a1-3) or the general formula (a1-4) is particularly preferable.

The component (A2) may be used alone or in combination of two or more thereof.

The molecular weight of the component (A2) is not particularly limited as long as it is in the range of 600 or more, and can be determined according to the desired performance. For example, from the viewpoint of further improving solvent solubility and compatibility with other resins, the molecular weight of the component (A2) may be 650 or more, 700 or more, or 750 or more. In addition, the upper limit of the molecular weight of the component (A2) may be 10,000 or less, or 7,000 or less.

[Content Ratio of Component (A1) and Component (A2)]

In the resin composition of the present embodiment, the content ratio [(A1)/(A2)] of the component (A1) and the component (A2) is not particularly limited; however, from the viewpoint of compatibility with other resins, dielectric characteristics, low thermal expansion and heat resistance, it is, on a mass basis, preferably 5/95 to 50/50, more preferably 10/90 to 45/55, still more preferably 15/85 to 40/60, and particularly preferably 20/80 to 35/65.

When the content ratio [(A1)/(A2)] is 5/95 or more, moldability and workability tend to be further improved, and when the content ratio is 50/50 or less, dielectric characteristics, mechanical characteristics and flame retardancy tends to be further improved.

The total content of the components (A1) and (A2) in the component (A) is not particularly limited; however, from the viewpoint of dielectric characteristics, mechanical characteristics, flame retardancy, moldability and workability, it is preferably 80% by mass or more, more preferably 90% by mass or more, still more preferably 95% by mass or more, and may be 100% by mass.

<(B) Polymer Having Hydrocarbon Chain or Polyether Chain in Main Chain Thereof>

The component (B) is a polymer having a hydrocarbon chain or a polyether chain in a main chain thereof, and is a component that contributes to improving dielectric characteristics.

In addition, the "main chain" in the present embodiment represents the relatively longest bond chain in the polymer molecule, and a "side chain" in the present embodiment represents an atomic group branched from the main chain.

In addition, the "hydrocarbon chain" in the present embodiment means a structure in which carbon atoms that are bonded to hydrogen atoms are linked in a chain.

In addition, the "polyether chain" in the present embodiment means a structure in which units containing polyether bonds are linked in a chain.

The component (B) may be used alone or in combination of two or more thereof.

Examples of the polymer having a hydrocarbon chain in a main chain thereof include a conjugated diene polymer, a styrene-based elastomer, and modified products thereof. In addition, examples of the polymer having a polyether chain in a main chain thereof include a polyphenylene ether and a modified product of polyphenylene ether. Of these, from the viewpoint of compatibility with other resins, dielectric characteristics and heat resistance, a polymer having a hydrocarbon chain in a main chain thereof is preferred, and a modified conjugated diene polymer and a styrene-based elastomer are more preferred. From the same point of view, the modified conjugated diene polymer is preferably a modified conjugated diene polymer (B1) obtained by modifying (b1) a conjugated diene polymer having a vinyl group in a side chain thereof with (b2) a maleimide compound having two or more N-substituted maleimide groups.

Hereinafter, the modified conjugated diene polymer (B1) may be referred to as "component (B1)", and the styrene-based elastomer may be referred to as "(B2) a styrene-based elastomer" or "component (B2)".

(Modified Conjugated Diene Polymer (B1))

The component (B1) is obtained by modifying (b1) a conjugated diene polymer having a vinyl group in a side chain thereof [hereinafter sometimes referred to as "(b1) a conjugated diene polymer" or "component (b1)".] with (b2) a maleimide compound having two or more N-substituted maleimide groups [hereinafter sometimes referred to as "(b2) a maleimide compound" or "component (b2)".].

By using the component (B1) as the component (B), the compatibility, dielectric characteristics, heat resistance and low thermal expansion of a resulting cured product of the resin composition tend to be even better. This is presumed to be due to the fact that the N-substituted maleimide group introduced into the conjugated diene polymer reacts favorably with (A) the maleimide compound or a derivative thereof, thereby further enhancing the compatibility with (A) the maleimide compound or a derivative thereof, and improving the curability of the resin composition as a whole.

The component (B1) may be used alone or in combination of two or more thereof.

[(b1) Conjugated Diene Polymer Having Vinyl Group in Side Chain Thereof]

The component (b1) is not particularly limited as long as it is a conjugated diene polymer having a vinyl group in a side chain thereof.

The component (b1) may be used alone or in combination of two or more thereof.

The component (b1) is preferably a conjugated diene polymer having a plurality of vinyl groups in side chains thereof. The number of vinyl groups that the component (b1) has in one molecule is not particularly limited; however, from the viewpoint of dielectric characteristics and heat resistance, it is preferably 3 or more, more preferably 5 or more, and still more preferably 10 or more.

The conjugated diene polymer as used herein means a polymer of a conjugated diene compound.

Examples of the conjugated diene compound include 1,3-butadiene, isoprene, 1,3-pentadiene, 2,3-dimethyl-1,3-butadiene, 2-phenyl-1,3-butadiene, and 1,3-hexadiene.

The conjugated diene polymer may be a polymer of one conjugated diene compound or a polymer of two or more conjugated diene compounds.

Further, the conjugated diene polymer may be obtained by copolymerizing one or more conjugated diene compounds and one or more monomers other than the conjugated diene compounds. The polymerization mode in that case is not particularly limited, and may be a random polymerization, a block polymerization or a graft polymerization.

Specific examples of the component (b1) include a polybutadiene having a 1,2-vinyl group, a butadiene-styrene copolymer having a 1,2-vinyl group, and a polyisoprene having a 1,2-vinyl group. Of these, from the viewpoint of dielectric characteristics and heat resistance, a polybutadiene having a 1,2-vinyl group and a butadiene-styrene copolymer having a 1,2-vinyl group are preferable, and a polybutadiene having a 1,2-vinyl group is more preferable. In addition, the polybutadiene having a 1,2-vinyl group is preferably a butadiene homopolymer having a 1,2-vinyl group.

The butadiene-derived 1,2-vinyl group of the component (b1) is a vinyl group contained in a butadiene-derived structural unit represented by the following formula (b1-1).

(b1-1)

When the component (b1) is a polybutadiene having a 1,2-vinyl group, the content of structural units having a 1,2-vinyl group with respect to all butadiene-derived structural units constituting polybutadiene [hereinafter sometimes referred to as "vinyl group content".] is not particularly limited; however, it is preferably 50 mol % or more, more preferably 60 mol % or more, still more preferably 70 mol % or more, particularly preferably 80 mol % or more, and most preferably 85 mol % or more, from the viewpoint of compatibility with other resins, dielectric characteristics, low thermal expansion and heat resistance. In addition, the upper limit of the vinyl group content is not particularly limited, and may be 100 mol % or less, 97 mol % or less, or 95 mol % or less. The structural unit having a 1,2-vinyl group is preferably a butadiene-derived structural unit represented by the above formula (b1-1).

From the same point of view, the polybutadiene having a 1,2-vinyl group is preferably a 1,2-polybutadiene homopolymer.

The number average molecular weight of the component (b1) is not particularly limited; however, from the viewpoint of compatibility with other resins, dielectric characteristics, low thermal expansion and heat resistance, it is preferably 400 to 4,000, more preferably 500 to 3,000, still more preferably 600 to 2,000, and particularly preferably 700 to 1,500.

((b2) Maleimide Compound Having Two or More N-substituted Maleimide Groups)

The component (b2) may be any maleimide compound having two or more N-substituted maleimide groups, and examples of the aforementioned maleimide compound (A) can be used.

The component (b2) may be used alone or in combination of two or more thereof.

Of these, from the viewpoint of solubility in an organic solvent and gelation suppression at the time of reaction, as well as from the viewpoint of compatibility with other resins of the obtained component (B), dielectric characteristics, low thermal expansion and heat resistance, the component (b2) is preferably a bismaleimide compound represented by the above (a1-11), and of these, a compound represented by the following general formula (b2-1) is more preferable.

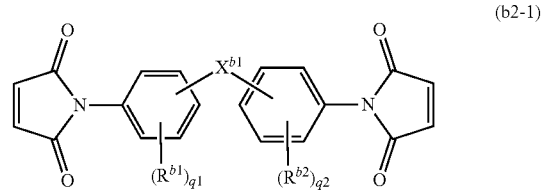

(b2-1)

(In the formula, $R^{b1}$ and $R^{b2}$ each are independently an aliphatic hydrocarbon group having 1 to 5 carbon atoms; $X^{b1}$ is an alkylene group having 1 to 5 carbon atoms, an alkylidene group having 2 to 5 carbon atoms, an ether group, a sulfide group, a sulfonyl group, a carbonyloxy group, a keto group, a single bond, or a divalent group represented by the following general formula (b2-1-1); q1 and q2 each are independently an integer of 0 to 4.)

Examples of the aliphatic hydrocarbon group having 1 to 5 carbon atoms represented by $R^{b1}$ and $R^{b2}$ include a methyl group, an ethyl group, an n-propyl group, an isopropyl group, an n-butyl group, an isobutyl group, a t-butyl group, and an n-pentyl group. The aliphatic hydrocarbon group is preferably an aliphatic hydrocarbon group having 1 to 3 carbon atoms, more preferably an alkyl group having 1 to 3 carbon atoms, and still more preferably a methyl group or an ethyl group, from the viewpoint of compatibility with other resins and gelation suppression at the time of reaction.

Examples of the alkylene group having 1 to 5 carbon atoms represented by $X^{b1}$ include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms, more preferably an alkylene group having 1 or 2 carbon atoms, and even more preferably a methylene group.

Examples of the alkylidene group having 2 to 5 carbon atoms represented by $X^{b1}$ include an ethylidene group, a propylidene group, an isopropylidene group, a butylidene group, an isobutylidene group, a pentylidene group, and an isopentylidene group.

q1 and q2 each are independently an integer of 0 to 4, and from the viewpoint of availability, compatibility with other resins, and gelation suppression at the time of reaction, both of q1 and q2 are preferably integers of 1 to 3, more preferably 1 or 2, and still more preferably 2.

From a similar point of view, q1+q2 is preferably an integer of 1 to 8, more preferably an integer of 2 to 6, and still more preferably 4.

When q1 or q2 is an integer of 2 or more, the plurality of $R^{b1}$'s or $R^{b2}$'s may be the same or different, respectively.

The divalent group represented by the general formula (b2-1-1) represented by $X^{b1}$ is as follows.

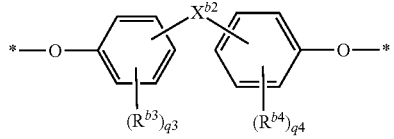
(b2-1-1)

(In the formula, $R^{b3}$ and $R^{b4}$ each are independently an aliphatic hydrocarbon group having 1 to 5 carbon atoms or a halogen atom; $X^{b2}$ is an alkylene group having 1 to 5 carbon atoms, an alkylidene group having 2 to 5 carbon atoms, an ether group, a sulfide group, a sulfonyl group, a carbonyloxy group, a keto group, or a single bond; q3 and q4 each are independently an integer of 0 to 4; * represents a bonding site.)

The aliphatic hydrocarbon group having 1 to 5 carbon atoms and the halogen atom represented by $R^{b3}$ and $R^{b4}$ are explained in the same manner as for $R^{b1}$.

Examples of the alkylene group having 1 to 5 carbon atoms and the alkylidene group having 2 to 5 carbon atoms represented by $X^{b2}$ include the same groups as those for the alkylene group having 1 to 5 carbon atoms and the alkylidene group having 2 to 5 carbon atoms represented by $X^{b1}$.

q3 and q4 each are independently an integer of 0 to 4, and both are preferably integers of 0 to 2, more preferably 0 or 1, and still more preferably 0, from the viewpoint of availability. When q3 or q4 is an integer of 2 or more, the plurality of $R^{b3}$'s or $R^{b4}$'s may be the same or different, respectively.

Of the compounds represented by the general formula (b2-1), from the viewpoint of the solubility in an organic solvent and the gelation suppression at the time of reaction, as well as from the viewpoint of compatibility with other resins of the obtained component (B1), dielectric characteristics, low thermal expansion and heat resistance, 4,4'-diphenylmethanebismaleimide, 2,2-bis[4-(4-maleimidophenoxy)phenyl]propane, and 3,3'-dimethyl-5,5'-diethyl-4,4'-diphenylmethanebismaleimide are preferred, and 3,3'-dimethyl-5,5'-diethyl-4,4'-diphenylmethanebismaleimide is more preferred.

The modified conjugated diene polymer (B1) preferably has a substituent [hereinafter sometimes referred to as "substituent (x)".] formed by a reaction between the vinyl group of the conjugated diene polymer (b1) and the N-substituted maleimide group of the maleimide compound (b2).

From the viewpoint of compatibility with other resins, dielectric characteristics, low thermal expansion and heat resistance, the substituent (x) is preferably a group containing a structure represented by the following general formula (B1-11) or (B1-12) as a structure derived from the maleimide compound (b2).

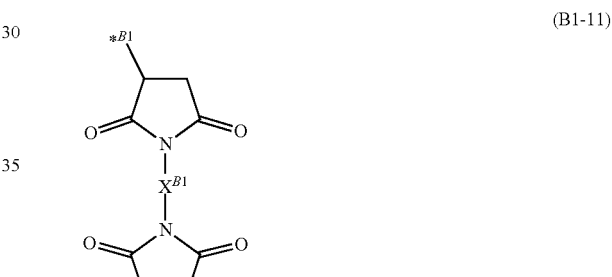
(B1-11)

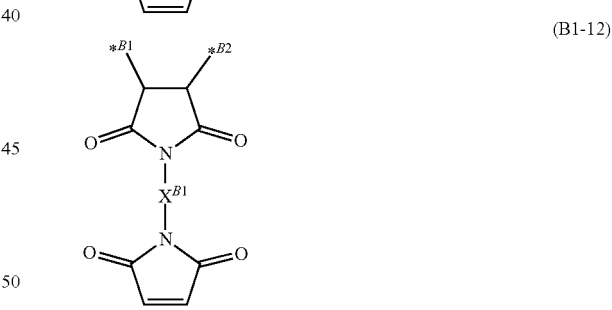
(B1-12)

(In the formula, $X^{B1}$ is a divalent organic group; $*^{B1}$ is a site that is bonded to a carbon atom derived from a vinyl group in a side chain of the conjugated diene polymer (b1); $*^{B2}$ is a site that is bonded to another atom.)

$X^{B1}$ in the above general formulas (B1-11) and (B1-12) is as described for $X^{b1}$ in the above general formula (b2-1).

Further, the substituent (x) more preferably includes one or more selected from the group consisting of a structure represented by the following general formula (B1-21) and a structure represented by the following general formula (B1-22) as a structure derived from the maleimide compound (b2) from the viewpoint of compatibility with other resins, dielectric characteristics, low thermal expansion and heat resistance.

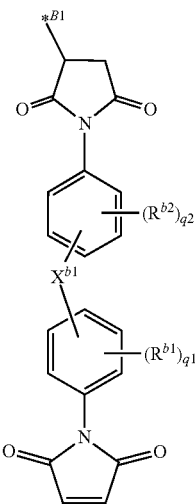

(B1-21)

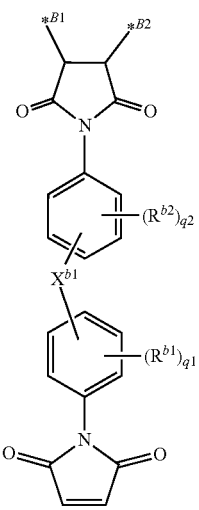

(B1-22)

(In the formula, $R^{b1}$, $R^{b2}$, $X^{b1}$, q1 and q2 are as described in the above general formula (b2-1). $*^{B1}$ and $*^{B2}$ are as described in the above general formulas (B1-11) and (B1-12).)

The modified conjugated diene polymer (B1) preferably has a substituent (x) and a vinyl group (y) in a side chain thereof.

The extent to which the substituent (x) is present in the modified conjugated diene polymer (B1) can be indicated by the extent to which the vinyl group of the component (b1) has been modified by the component (b2) [hereinafter sometimes referred to as "vinyl group modification rate".].

The vinyl group modification rate is not particularly limited; however, it is preferably 20 to 70%, more preferably 30 to 60%, and still more preferably 40 to 50%, from the viewpoint of compatibility with other resins, dielectric characteristics, low thermal expansion and heat resistance. Here, the vinyl group modification rate is a value determined by a method described in the Examples.

The vinyl group (y) is preferably a 1,2-vinyl group of a structural unit derived from butadiene.

The number average molecular weight of the modified conjugated diene polymer (B1) is not particularly limited; however, it is preferably 700 to 6,000, more preferably 800 to 5,000, still more preferably 900 to 4,500, and particularly preferably 1,000 to 4,000, from the viewpoint of compatibility with other resins, dielectric characteristics, low thermal expansion and heat resistance.

[Method of Producing Component (B1)]

The method of reacting the conjugated diene polymer (b1) and the maleimide compound (b2) is not particularly limited. For example, the component (B1) can be obtained by charging the conjugated diene polymer (b1), the maleimide compound (b2), a reaction catalyst, and an organic solvent into a reaction vessel and reacting while, when necessary, heating, keeping warm, stirring, etc.

The reaction temperature in the above reaction is preferably 70 to 120° C., more preferably 80 to 110° C., and still more preferably 85 to 105° C., from the viewpoint of workability and gelation suppression at the time of the reaction.

In addition, the reaction time in the above reaction is preferably 0.5 to 15 hours, more preferably 1 to 10 hours, and still more preferably 3 to 7 hours.

However, these reaction conditions can be appropriately adjusted according to the type of raw material used, etc., and are not particularly limited.

Examples of the organic solvent used in the above reaction include an alcohol-based solvent, such as methanol, ethanol, butanol, butyl cellosolve, ethylene glycol monomethyl ether, and propylene glycol monomethyl ether; a ketone-based solvent, such as acetone, methyl ethyl ketone, methyl isobutyl ketone, and cyclohexanone; an aromatic hydrocarbon-based solvent, such as toluene, xylene and mesitylene; an ester-based solvent, such as methoxyethyl acetate, ethoxyethyl acetate, butoxyethyl acetate, and ethyl acetate; and a nitrogen atom-containing solvent, such as N,N-dimethylformamide, N,N-dimethylacetamide, and N-methyl-2-pyrrolidone.

The organic solvent may be used alone or in combination of two or more thereof. Of these, toluene is preferable from the viewpoint of resin solubility.

When the above reaction is carried out in an organic solvent, although the total content of the conjugated diene polymer (b1) and the maleimide compound (b2) in the reaction solution is not particularly limited, it is preferably 10 to 70% by mass, more preferably 15 to 60% by mass, and still more preferably 20 to 50% by mass. When the total content of the conjugated diene polymer (b1) and the maleimide compound (b2) is equal to or more than the above lower limit, a good reaction rate is obtained, and productivity tends to be further improved. Further, when the total content of the conjugated diene polymer (b1) and the maleimide compound (b2) is equal to or less than the above upper limit, a better solubility is obtained, stirring efficiency is improved, and gelation tends to be more suppressed.

As the reaction catalyst, examples listed for a curing accelerator (E), which will be described later, can be used. Of these, an organic peroxide is preferable, and α,α'-bis(t-butylperoxy)diisopropylbenzene is more preferable, from the viewpoint of obtaining sufficient reactivity while suppressing gelation at the time of reaction.

The reaction catalyst may be used alone or in combination of two or more thereof.

Although the use amount of the reaction catalyst is not particularly limited, it is preferably 0.01 to 1.2 parts by mass, more preferably 0.03 to 1.0 parts by mass, and still more preferably 0.05 to 0.8 parts by mass, based on 100 parts by mass of a total amount of the conjugated diene polymer (b1) and the maleimide compound (b2).

Although a ratio of the number of moles (Mm) of the N-substituted maleimide groups of the maleimide compound (b2) to the number of moles (Mv) of the side chain vinyl groups of the conjugated diene polymer (b1) (Mm/Mv) at the time of carrying out the aforementioned reaction is not particularly limited, it is preferably 0.01 to 0.5, more preferably 0.02 to 0.4, and still more preferably 0.04 to 0.3, from the viewpoint of compatibility with other resins of the obtained component (B1) and gelation suppression at the time of the reaction.

(Styrene-Based Elastomer (B2))

The component (B2) is not particularly limited as long as it is an elastomer having a structural unit derived from a styrene-based compound.

The component (B2) may be used alone or in combination of two or more thereof.

The component (B2) preferably has a styrene-derived structural unit represented by the following general formula (B2-1).

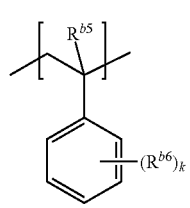

(B2-1)

(In the formula, $R^{b5}$ is a hydrogen atom or an alkyl group having 1 to 5 carbon atoms, $R^{b6}$ is an alkyl group having 1 to 5 carbon atoms, and k is an integer of 0 to 5.)

Examples of the alkyl group having 1 to 5 carbon atoms represented by $R^{b5}$ and $R^{b6}$ include a methyl group, an ethyl group, and an n-propyl group. Of these, an alkyl group having 1 to 3 carbon atoms is preferred, an alkyl group having 1 or 2 carbon atoms is more preferred, and a methyl group is even more preferred.

k is preferably an integer of 0 to 2, more preferably 0 or 1, and still more preferably 0.

Examples of a structural unit other than the structural units derived from a styrene-based compound of the component (B2) include a structural unit derived from butadiene, a structural unit derived from isoprene, a structural unit derived from maleic acid, and a structural unit derived from maleic anhydride.

The structural unit derived from butadiene and the structural unit derived from isoprene may be hydrogenated. When hydrogenated, the structural unit derived from butadiene becomes a structural unit in which an ethylene unit and a butylene unit are mixed, and the structural unit derived from isoprene becomes a structural unit in which an ethylene unit and a propylene unit are mixed.

From the viewpoint of dielectric characteristics, adhesion to a conductor, heat resistance, glass transition temperature and low thermal expansion, the component (B2) is preferably one or more selected from the group consisting of a hydrogenated styrene-butadiene-styrene block copolymer (SEBS, SBBS), a hydrogenated styrene-isoprene-styrene block copolymer (SEPS), and a styrene-maleic anhydride copolymer (SMA), more preferably one or more selected from the group consisting of a hydrogenated styrene-butadiene-styrene block copolymer (SEBS) and a hydrogenated styrene-isoprene-styrene block copolymer (SEPS), and still more preferably a hydrogenated styrene-butadiene-styrene block copolymer (SEBS).

In the above SEBS, although the content of structural units derived from styrene [hereinafter sometimes referred to as "styrene content".] is not particularly limited, it is preferably 5 to 80% by mass, more preferably 10 to 75% by mass, still more preferably 15 to 70% by mass, and particularly preferably 20 to 50% by mass, from the viewpoint of dielectric characteristics, adhesion to a conductor, heat resistance, glass transition temperature and low thermal expansion.

Although the melt flow rate (MFR) of SEBS is not particularly limited, it is preferably 0.1 to 20 g/10 min, more preferably 0.3 to 17 g/10 min, and still more preferably 0.5 to 15 g/10 min, under measurement conditions of 230° C. and a load of 2.16 kgf (21.2 N).

Examples of commercially available products of SEBS include Tuftec (registered trademark) H series and M series manufactured by Asahi Kasei Corporation, Septon (registered trademark) series manufactured by Kuraray Co., Ltd., and Kraton (registered trademark) G polymer series manufactured by Kraton Polymer Japan Co., Ltd.

Although the weight average molecular weight (Mw) of the component (B2) is not particularly limited, it is preferably 12,000 to 1,000,000, more preferably 30,000 to 500,000, still more preferably 50,000 to 120,000, and particularly preferably 70,000 to 100,000. The weight average molecular weight (Mw) is measured by gel permeation chromatography (GPC) in terms of polystyrene.

[Contents of Modified Conjugated Diene Polymer (B1) and Styrene-based Elastomer (B2)]

In the resin composition of the present embodiment, when the component (B1) and the component (B2) are used together, although the content ratio of the component (B1) and the component (B2) [(B1)/(B2)] is not particularly limited, from the viewpoint of moldability, compatibility with other resins and dielectric characteristics, it is preferably 5/95 to 70/30, more preferably 10/90 to 60/40, still more preferably 15/85 to 50/50, and particularly preferably 20/80 to 40/60 on a mass basis.

<Contents of (A) Maleimide Compound or Derivative thereof and Component (B), and Content Ratios thereof>

In the resin composition of the present embodiment, although the content of the component (A) is not particularly limited, it is preferably 10 to 90 parts by mass, more preferably 20 to 80 parts by mass, still more preferably 30 to 70 parts by mass, and particularly preferably 35 to 60 parts by mass, based on 100 parts by mass of the total resin components in the resin composition. When the content of the component (A) is equal to or more than the aforementioned lower limit, heat resistance, moldability, workability and flame retardancy tend to be further improved. Moreover, when the content of the component (A) is equal to or less than the aforementioned upper limit, dielectric characteristics and moldability tend to be further improved.

In the resin composition of the present embodiment, although the content of the component (B) is not particularly limited, it is preferably 10 to 90 parts by mass, more preferably 20 to 80 parts by mass, still more preferably 30 to 70 parts by mass, and particularly preferably 40 to 65 parts by mass, based on 100 parts by mass of the total resin components in the resin composition. When the content of the component (B) is equal to or more than the aforementioned lower limit, dielectric characteristics and moisture absorption resistance tend to be further improved. Moreover, when the content of the component (B) is equal to or less than the aforementioned upper limit, heat resistance, moldability, workability and flame retardancy tend to be further improved.

Here, in the present specification, the "resin component" refers to the component (A), the component (B), and further, any resin that is used arbitrarily. That is, when the resin composition does not contain an arbitrary resin, the "resin component" refers to the component (A) and the component (B). Moreover, when the resin composition contains an arbitrary resin, the "resin component" includes the component (A), the component (B), and the arbitrary resin.

Although the content ratio of the component (A) and the component (B) [(A)/(B)] is not particularly limited, from the viewpoint of compatibility with other resins, dielectric characteristics, low thermal expansion and heat resistance, it is, on a mass basis, preferably 0.3 to 3.0, more preferably 0.4 to 2.5, still more preferably 0.5 to 2.0, particularly preferably 0.6 to 1.5, and most preferably 0.7 to 1.0. When the content ratio of the component (A) and the component (B) [(A)/(B)] is equal to or more than the aforementioned lower limit, heat resistance, moldability, workability and flame retardancy tend to be further improved. Further, when the content ratio of the component (A) and the component (B) [(A)/(B)] is equal to or less than the aforementioned upper limit, the dielectric characteristics tend to be further improved.

<Other Components>

The resin composition of the present embodiment may be formed further containing other components depending on desired performance.

Examples of the other components include one or more selected from the group consisting of an inorganic filler (C) [hereinafter sometimes referred to as "component (C)".], a flame retardant (D) [hereinbelow sometimes referred to as "component (D)".], and a curing accelerator (E) [hereinafter sometimes referred to as "component (E)".].

However, depending on desired performance, the resin composition of the present embodiment may not contain one or more selected from the group consisting of an inorganic filler (C), a flame retardant (D), and a curing accelerator (E).

These components are described in detail below.

(Inorganic Filler (C))

By containing the inorganic filler (C) in the resin composition of the present embodiment, low thermal expansion, elastic modulus, heat resistance and flame retardancy tend to be further improved.

The inorganic filler (C) may be used alone or in combination of two or more thereof.

Examples of the inorganic filler (C) include silica, alumina, titanium oxide, mica, beryllia, barium titanate, potassium titanate, strontium titanate, calcium titanate, aluminum carbonate, magnesium hydroxide, aluminum hydroxide, silicon aluminum oxide, calcium carbonate, calcium silicate, magnesium silicate, silicon nitride, boron nitride, clay, talc, aluminum borate, and silicon carbide. Of these, silica, alumina, mica, and talc are preferred, silica and alumina are more preferred, and silica is even more preferred, from the viewpoints of low thermal expansion, elastic modulus, heat resistance, and flame retardancy.

Examples of silica include precipitated silica that is produced by a wet method and has a high water content, and dry-process silica that is produced by a dry method and contains almost no bound water. Further, examples of the dry-process silica include crushed silica, fumed silica, and fused silica, depending on the difference in production methods.

Although the particle size of the inorganic filler (C) is not particularly limited, it is preferably 0.01 to 20 µm, more preferably 0.1 to 10 µm, even more preferably 0.2 to 1 µm, and particularly preferably 0.3 to 0.8 µm. Here, the particle size of the inorganic filler (C) refers to an average particle size, and is a particle size at the point corresponding to 50% volume when the cumulative frequency distribution curve of the particle size is obtained with a total volume of the particles as 100%. The particle size of the inorganic filler (C) can be measured with a particle size distribution analyzer using a laser diffraction scattering method.

The shape of the inorganic filler (C) may be spherical, pulverized, etc., preferably spherical.

When the resin composition of the present embodiment contains an inorganic filler (C), although the content of the inorganic filler (C) in the resin composition is not particularly limited, from the viewpoint of low thermal expansion, elastic modulus, heat resistance and flame retardancy, it is preferably 5 to 70% by mass, more preferably 15 to 65% by mass, still more preferably 20 to 60% by mass, particularly preferably 30 to 55% by mass, and most preferably 40 to 50% by mass, relative to a total solid content (100% by mass) of the resin composition.

When the resin composition of the present embodiment contains the inorganic filler (C), a coupling agent may be used for the purpose of improving the dispersibility of the inorganic filler (C) and the adhesion to an organic component. Examples of the coupling agent include a silane coupling agent and a titanate coupling agent.

When a coupling agent is used, a surface treatment method for the inorganic filler (C) may be an integral blend treatment method in which the coupling agent is added after the inorganic filler (C) is blended in the resin composition, or may be a method of previously subjecting the inorganic filler (C) to a surface treatment with the coupling agent in a dry or wet mode. Of these, the method of previously subjecting the inorganic filler (C) to a surface treatment with the coupling agent in a dry or wet mode is preferable from the viewpoint of more effectively revealing the advantages of the inorganic filler (C).

For the purpose of improving dispersibility in the resin composition, the inorganic filler (C) may be made into a state of slurry in which it is previously dispersed in an organic solvent and then mixed with other components.

(Flame Retardant (D))

By containing the flame retardant (D) in the resin composition of the present embodiment, the flame retardancy of the resin composition tends to be further improved.

The flame retardant (D) may be used alone or in combination of two or more thereof. Furthermore, a flame retardant auxiliary agent may be contained as needed.

Examples of the flame retardant (D) include a phosphorus-based flame retardant, a metal hydrate, and a halogen-based flame retardant, and from the viewpoint of environmental problems, a phosphorus-based flame retardant and a metal hydrate are preferred.

—Phosphorus-based Flame Retardant—

The phosphorus-based flame retardant is not particularly limited as long as it contains a phosphorus atom among those commonly used as flame retardants, and may be an inorganic phosphorus-based flame retardant or an organic phosphorus-based flame retardant. From the viewpoint of environmental problems, the phosphorus-based flame retardant preferably does not contain a halogen atom. The phosphorus-based flame retardant is preferably an organic phosphorus-based flame retardant from the viewpoint of dielectric characteristics, adhesion to a conductor, heat resistance, glass transition temperature, low thermal expansion, and flame retardancy.

Examples of the inorganic phosphorus-based flame retardant include red phosphorus; ammonium phosphates, such as monoammonium phosphate, diammonium phosphate, triammonium phosphate and ammonium polyphosphate; inorganic nitrogen-containing phosphorus compounds, such as phosphate amide; phosphoric acid; and phosphine oxide.

Examples of the organic phosphorus-based flame retardant include aromatic phosphoric acid esters, monosubstituted phosphonic acid diesters, disubstituted phosphinic acid esters, metal salts of disubstituted phosphinic acids, organic nitrogen-containing phosphorus compounds, and cyclic organic phosphorus compounds. Of these, aromatic phosphoric acid ester compounds and metal salts of disubstituted phosphinic acids are preferred. Here, examples of metal salts include lithium salts, sodium salts, potassium salts, calcium salts, magnesium salts, aluminum salts, titanium salts, and zinc salts. Of these, aluminum salts are preferred. In addition, among the organic phosphorus-based flame retardants, aromatic phosphoric acid esters are preferred.

Examples of the aromatic phosphoric acid esters include triphenyl phosphate, tricresyl phosphate, trixylenyl phosphate, cresyl diphenyl phosphate, cresyl di-2,6-xylenyl phosphate, resorcinol bis(diphenyl phosphate), 1,3-phenylene bis(di-2,6-xylenyl phosphate), bisphenol A-bis(diphenyl phosphate), and 1,3-phenylene bis(diphenyl phosphate).

Examples of the monosubstituted phosphonic acid diesters include divinyl phenylphosphonate, diallyl phenylphosphonate, and bis(1-butenyl) phenylphosphonate.

Examples of the disubstituted phosphinic acid esters include phenyl diphenylphosphinate and methyl diphenylphosphinate.

Examples of the metal salts of disubstituted phosphinic acids include metal salts of dialkylphosphinic acid, metal salts of diallylphosphinic acid, metal salts of divinylphosphinic acid, and metal salts of diarylphosphinic acid. Aluminum salts are preferred as these metal salts.

Examples of the organic nitrogen-containing phosphorus compounds include phosphazene compounds, such as bis(2-allylphenoxy)phosphazene and dicresylphosphazene; melamine phosphate; melamine pyrophosphate; melamine polyphosphate; and melam polyphosphate.

Examples of the cyclic organic phosphorus compounds include 9,10-dihydro-9-oxa-10-phosphaphenanthrene-10-oxide, and 10-(2,5-dihydroxyphenyl)-9,10-dihydro-9-oxa-10-phosphaphenanthrene-10-oxide.

Of these, the aromatic phosphoric acid esters and the metal salts of disubstituted phosphinic acids are preferred, 1,3-phenylenebis(di-2,6-xylenyl phosphate) and aluminum salts of dialkylphosphinic acids are more preferred, and aluminum tris-diethylphosphinate is even more preferred.
—Metal Hydrate—

Examples of the metal hydrate include an aluminum hydroxide hydrate and a magnesium hydroxide hydrate.
—Halogen-based Flame Retardant—

Examples of the halogen-based flame retardant include a chlorine-based flame retardant and a bromine-based flame retardant. Examples of the chlorine-based flame retardant include a chlorinated paraffin.

When the resin composition of the present embodiment contains the flame retardant (D), although the content of the flame retardant (D) is not particularly limited, it is preferably 1 to 15 parts by mass, more preferably 3 to 10 parts by mass, and even more preferably 4 to 8 parts by mass, based on 100 parts by mass of the total resin components in the resin composition. When the content of the flame retardant (D) is equal to or more than the aforementioned lower limit, flame retardancy tends to be further improved. Moreover, when the content of the flame retardant (D) is equal to or less than the aforementioned upper limit, moldability, high adhesion to a conductor, heat resistance, and high glass transition temperature tend to be further improved.

(Curing Accelerator (E))

By containing the curing accelerator (E), curability of the resin composition of the present embodiment is improved, and dielectric characteristics, heat resistance, adhesion to a conductor, elastic modulus, and glass transition temperature tend to be further improved.

The curing accelerator (E) may be used alone or in combination of two or more thereof.

Examples of the curing accelerator (E) include an acidic catalyst, such as p-toluenesulfonic acid; an amine compound, such as triethylamine, pyridine and tributylamine; an imidazole compound, such as methylimidazole and phenylimidazole; an isocyanate-masked imidazole compound, such as an addition reaction product of a hexamethylene diisocyanate resin and 2-ethyl-4-methylimidazole; a tertiary amine compound; a quaternary ammonium compound; a phosphorus-based compound such as triphenylphosphine; an organic peroxide, such as dicumyl peroxide, 2,5-dimethyl-2,5-bis(t-butylperoxy)hexyne-3,2,5-dimethyl-2,5-bis(t-butylperoxy)hexane, t-butylperoxyisopropyl monocarbonate, and $\alpha,\alpha'$-bis(t-butylperoxy)diisopropylbenzene; and carboxylate of manganese, cobalt, zinc, etc.

Of these, from the viewpoint of heat resistance, glass transition temperature and storage stability, an imidazole compound, an isocyanate-masked imidazole compound, an organic peroxide and a carboxylate are preferred, an organic peroxide is more preferred, and dicumyl peroxide is still more preferred.

When the resin composition of the present embodiment contains the curing accelerator (E), although the content of the curing accelerator (E) is not particularly limited, it is preferably 0.01 to 10 parts by mass, more preferably 0.05 to 8 parts by mass, still more preferably 0.1 to 6 parts by mass, and particularly preferably 0.5 to 5 parts by mass, based on 100 parts by mass of the total resin components in the resin composition. When the content of the curing accelerator (E) is equal to or more than the aforementioned lower limit, dielectric characteristics, heat resistance, adhesion to a conductor, elastic modulus and glass transition temperature tend to be further improved. Moreover, when the content of the curing accelerator (E) is equal to or less than the aforementioned upper limit, storage stability tends to be further improved.

The resin composition of the present embodiment may further contain, as necessary, one or more selected from the group consisting of resin materials other than the aforementioned components, an antioxidant, a heat stabilizer, an antistatic agent, an ultraviolet absorber, a pigment, a colorant, a lubricant, and other additives. Each of these may be used alone or in combination of two or more thereof. Moreover, the amount of these to be used is not particularly limited, and may be used as necessary within a range that does not impair the effects of the present embodiment.

(Organic Solvent)

The resin composition of the present embodiment may contain an organic solvent from the viewpoint of facilitating handling, as well as from the viewpoint of facilitating production of a prepreg, which will be described later.

The organic solvent may be used alone or in combination of two or more thereof.

In the present specification, a resin composition containing an organic solvent is sometimes referred to as a resin varnish.

Examples of the organic solvent include an alcohol-based solvent, such as ethanol, propanol, butanol, methyl cellosolve, butyl cellosolve, and propylene glycol monomethyl ether; a ketone-based solvent, such as acetone, methyl ethyl ketone, methyl isobutyl ketone, and cyclohexanone; an ether-based solvent, such as tetrahydrofuran; an aromatic hydrocarbon-based solvent, such as toluene, xylene and mesitylene; a nitrogen atom-containing solvent, such as dimethylformamide, dimethylacetamide and N-methylpyrrolidone; a sulfur atom-containing solvent, such as dimethylsulfoxide; and an ester-based solvent, such as y-butyrolactone.

Of these, from the viewpoint of solubility, an alcohol-based solvent, a ketone-based solvent, a nitrogen atom-containing solvent, and an aromatic hydrocarbon-based solvent are preferred, an aromatic hydrocarbon-based solvent is more preferred, and toluene is even more preferred.

When the resin composition of the present embodiment contains an organic solvent, although the solid content concentration of the resin composition is not particularly limited, it is preferably 30 to 90% by mass, more preferably 35 to 80% by mass, and still more preferably 40 to 60% by mass. When the solid content concentration is within the aforementioned range, the handling of the resin composition tends to be easier, and the impregnating property into a base material and the appearance of the produced prepreg tend to be further improved. In addition, it becomes easier to adjust the solid content concentration of the resin in the prepreg, which will be described later, and it tends to be easier to produce a prepreg having a desired thickness.

The resin composition of the present embodiment can be produced by mixing the components (A) and (B), and other components used in combination as necessary, by a known method. In this case, each component may be dissolved or dispersed while stirring. Conditions such as the order of mixing, temperature, and time are not particularly limited, and may be arbitrarily set according to the type of raw materials.

Although the resin composition of the present embodiment is not particularly limited, in a compatibility evaluation in the Examples to be described later, the resin composition preferable has no macroscopic phase separation and precipitates even when left for one day, more preferably has no macroscopic phase separation and precipitates even when left for two days, and still more preferably has no macroscopic phase separation and precipitates even when left for seven days.

The dielectric constant (Dk) at 10 GHz of a cured product of the resin composition of the present embodiment is not particularly limited; however, it is preferably 3.0 or less, more preferably 2.9 or less, and still more preferably 2.8 or less. The dielectric constant (Dk) is preferably as small as possible, and the lower limit thereof is not particularly limited. However, considering a balance with other physical properties, the dielectric constant may be, for example, 2.4 or more, or 2.5 or more.

The above dielectric constant (Dk) is a value based on a cavity resonator perturbation method, more specifically, a value measured by a method described in the Examples.

The dielectric loss tangent (Df) at 10 GHz of the cured product of the resin composition of the present embodiment is not particularly limited; however, it is preferably 0.0050 or less, more preferably 0.0040 or less, still more preferably 0.0030 or less, particularly preferably 0.0025 or less, and most preferably 0.0020 or less. The dielectric loss tangent (Df) is preferably as small as possible, and the lower limit thereof is not particularly limited. However, considering a balance with other physical properties, the dielectric loss tangent may be, for example, 0.0010 or more, or 0.0012 or more.

The above dielectric loss tangent (Df) is a value based on the cavity resonator perturbation method, more specifically, a value measured by a method described in the Examples.

[Prepreg]

The prepreg of the present embodiment is a prepreg containing the resin composition of the present embodiment or a semi-cured product of the resin composition.

That is, it can be said that the prepreg of the present embodiment is formed by containing the resin composition of the present embodiment. In the present specification, the term "formed by containing" means at least formed through a state of containing.

The prepreg of the present embodiment contains, for example, the resin composition of the present embodiment or a semi-cured product of the resin composition and a sheet-like fiber base material.

Although the sheet-like fiber base material is not particularly limited, it is, for example, preferably a sheet-like fiber-reinforced base material used for the purpose of reinforcing the prepreg.

As the sheet-like fiber base material contained in the prepreg of the present embodiment, known sheet-like fiber base materials used in laminated boards for various electrical insulating materials can be used.

Examples of materials for the sheet-like fiber base material include inorganic fibers, such as E glass, D glass, S glass, and Q glass; organic fibers, such as polyimide, polyester, and tetrafluoroethylene; and mixtures thereof. These sheet-like fiber base materials have shapes of, for example, woven fabrics, non-woven fabrics, robinks, chopped strand mats, surfacing mats, and the like.

Although the thickness of the sheet-like fiber base material is not particularly limited, it is, for example, 0.02 to 0.5 mm.

The sheet-like fiber base material may be one having been subjected to a surface treatment with a coupling agent or the like, or may be one having been subjected to a fiber opening treatment mechanically, from the viewpoint of the impregnating property of the resin composition, and the heat resistance, moisture absorption resistance and workability at the time of forming into a laminated board.

The prepreg of the present embodiment can be produced, for example, by impregnating or coating a sheet-like fiber base material with the resin composition of the present embodiment, and drying as necessary.

As a method of impregnating or coating a sheet-like fiber base material with the resin composition, for example, a hot melt method, a solvent method, or the like can be used.

The hot melt method is a method of impregnating or coating a sheet-like fiber base material with a resin composition that does not contain an organic solvent. Examples of one mode of the hot melt method include a method of once applying a resin composition to a coated paper having good releasability and then laminating the coated resin composition on a sheet-like fiber base material. Examples of another mode of the hot melt method include a method of directly applying a resin composition to a sheet-like fiber base material using a die coater or the like.

The solvent method is a method of impregnating or coating a sheet-like fiber base material with a resin composition containing an organic solvent. Specifically, examples thereof include a method of immersing a sheet-like fiber base material in a resin composition containing an organic solvent and then drying the base material.

Drying conditions of the solvent method may be, for example, heating in a drying furnace at a temperature of 80 to 200° C. for 1 to 30 minutes. By drying, the organic solvent is removed and the resin composition is semi-cured (B-staged) to obtain the prepreg of the present embodiment.

Although the solid content concentration derived from the resin composition in the prepreg of the present embodiment is not particularly limited, it is preferably 30 to 90% by mass. When the solid content concentration derived from the resin composition in the prepreg is within the aforementioned range, the moldability at the time of forming into a laminated board tends to be further improved.

[Resin Film]

The resin film of the present embodiment contains the resin composition of the present embodiment or the semi-cured product of the resin composition.

That is, it can be said that the resin film of the present embodiment is formed by containing the resin composition of the present embodiment.

The resin film of the present embodiment can be produced, for example, by applying a resin composition containing an organic solvent, that is, a resin varnish, to a support and drying by heating.

Examples of the support include films of polyolefins, such as polyethylene, polypropylene, and polyvinyl chloride; films of polyesters, such as polyethylene terephthalate [hereinafter sometimes referred to as "PET".] and polyethylene naphthalate; various plastic films, such as a polycarbonate film and a polyimide film; a metal foil, such as a copper foil and an aluminum foil; and a release paper.

The support may be one having been subjected to a surface treatment, such as a matting treatment and a corona treatment. In addition, the support may also be one having been subjected to a release treatment with a silicone resin-based release agent, an alkyd resin-based release agent, a fluorine resin-based release agent, or the like.

Although the thickness of the support is not particularly limited, it is preferably 10 to 150 µm, more preferably 20 to 100 µm, and still more preferably 25 to 50 µm.

As for a coating device for coating the resin varnish, for example, a coating device known to those skilled in the art, such as a comma coater, a bar coater, a kiss coater, a roll coater, a gravure coater, and a die coater can be used. These coating devices may be properly selected according to the film thickness to be formed.

A drying condition after applying the resin composition may be properly determined according to the content of the organic solvent, the boiling point, and the like. For example, in the case of a resin varnish containing 40 to 60% by mass of an aromatic hydrocarbon-based solvent, a resin film can be suitably formed by drying at 50 to 200° C. for about 3 to 10 minutes.

[Laminated Board]

The laminated board of the present embodiment includes a cured product of the resin composition of the present embodiment or a cured prepreg and a metal foil.

That is, it can be said that the laminated board of the present embodiment is formed by containing the resin composition or the prepreg of the present embodiment and a metal foil.

A laminated board having a metal foil is sometimes referred to as a metal-clad laminate.

The metal of the metal foil is not particularly limited; however, from the viewpoint of conductivity, it is preferably copper, gold, silver, nickel, platinum, molybdenum, ruthenium, aluminum, tungsten, iron, titanium, chromium, or an alloy containing one or more of these metal elements, more preferably copper and aluminum, and still more preferably copper.

The laminated board of the present embodiment can be produced, for example, by arranging metal foils on one or both sides of the prepreg of the present embodiment, followed by heat-press molding. In that case, only one prepreg may be used, or two or more prepregs may be laminated and used.

Although conditions for heat-press molding are not particularly limited, for example, the temperature can be set to 100 to 300° C., the pressure can be set to 0.2 to 10 MPa, and the time can be set to 0.1 to 5 hours. Also, for the heat-press molding, a method of holding a vacuum state for 0.5 to 5 hours using a vacuum press or the like may be used.

[Printed Wiring Board]

The printed wiring board of the present embodiment includes one or more selected from the group consisting of a cured product of the resin composition of the present embodiment, a cured product of the prepreg of the present embodiment, and the laminated board of the present embodiment.

That is, it can be said that the printed wiring board of the present embodiment is formed by containing one or more selected from the group consisting of the resin composition of the present embodiment, the prepreg of the present embodiment, and the laminated board of the present embodiment.

The printed wiring board of the present embodiment includes at least a structure containing a cured product of the resin composition of the present embodiment, a cured product of the prepreg of the present embodiment, or the laminated board of the present embodiment, and a conductor circuit layer.

The printed wiring board of the present embodiment can be produced by subjecting one or more selected from the group consisting a cured product of the resin composition of the present embodiment, a cured product of the prepreg of the present embodiment, a cured product of the resin film of the present embodiment, and the laminated board of the present embodiment to conductor circuit formation by a known method. Moreover, a multiplayer printed wiring board can also be produced by further subjecting to a multilayer adhesion process as necessary. The conductor circuit can be formed by properly performing, for example, drilling, metal plating, etching of metal foil, or the like.

[Semiconductor Package]

The semiconductor package of the present embodiment includes the printed wiring board of the present embodiment and a semiconductor element. The semiconductor package of the present embodiment can be produced by, for example, mounting a semiconductor chip, memory, etc. on the printed wiring board of the present embodiment by a known method.

The maleimide resin composition, the prepreg, the laminated board, the resin film, the printed wiring board, and the semiconductor package of the present embodiment are suitable for electronic devices that handle high frequency signals of 10 GHz or higher. In particular, the printed wiring board is useful as printed wiring boards for millimeter wave radars.

EXAMPLE

The present embodiment will be specifically described below with reference to the following Examples. However, the present embodiment is not limited to the following Examples.

In each example, the number average molecular weight was measured by the following procedure.
(Method of Measuring Number Average Molecular Weight)

The number average molecular weight was converted from a calibration curve using standard polystyrene by gel permeation chromatography (GPC). The calibration curve was approximated according to a cubic expression using standard polystyrene: TSKstandard POLYSTYRENE (Type: A-2500, A-5000, F-1, F-2, F-4, F-10, F-20, F-40) [a trade name, manufactured by Tosoh Corporation]. Measurement conditions of GPC are as follows.

Apparatus: High-speed GPC apparatus HLC-8320GPC
Detector: UV absorption detector UV-8320 [manufactured by Tosoh Corporation]
Column: Guard column; TSK Guardcolumn SuperHZ-L+ column; TSKgel SuperHZM-N+TSKgel SuperHZM-M+ TSKgel SuperH-RC (trade names, all manufactured by Tosoh Corporation)
Column size: 4.6×20 mm (guard column), 4.6×150 mm (column), 6.0×150 mm (reference column)
Eluent: Tetrahydrofuran
Sample concentration: 10 mg/5 mL
Injection volume: 25 μL
Flow rate: 1.00 mL/min
Measurement temperature: 40° C.
(Measurement of Vinyl Group Modification Rate)

In Production Examples to be described later, a solution containing the components (b1) and (b2) before the start of a reaction and a solution after the reaction were measured by GPC using the aforementioned method, and a peak area derived from the component (b2) before and after the reaction were determined. Thereafter, the vinyl group modification rate of the component (b2) was calculated by the following formula. The vinyl group modification rate corresponds to a reduction rate of the peak area derived from the component (b2) due to the reaction.

Vinyl group modification rate=[(peak area derived from component (b2) before reaction)−(peak area derived from component (b2) after reaction)]×100/(peak area derived from component (b2) before reaction)
[Production of Modified Conjugated Diene Polymer (B1)]

Production Examples 1 to 5

In a glass-made flask vessel having a volume of 2L, which was equipped with a thermometer, a reflux condenser, and a stirring device and which could be heated and cooled, the component (b1), the component (b2), an organic peroxide, and toluene as an organic solvent were charged in an amount shown in Table 1. Thereafter, the components (b1) and (b2) were allowed to react with each other with stirring at 90 to 100° C. for 5 hours in a nitrogen atmosphere to obtain solutions of modified conjugated diene polymers B1-1 to B1-5 having a solid concentration of 35% by mass.

TABLE 1

| Number of modified conjugated diene polymer | | | Production Ex. 1 B1-1 | Production Ex. 2 B1-2 | Production Ex. 3 B1-3 | Production Ex. 4 B1-4 | Production Ex. 5 B1-5 |
|---|---|---|---|---|---|---|---|
| Component (b1) | Polybutadiene 1 | Parts by mass | 33.8 | 33.1 | | | |
| | Polybutadiene 2 | Parts by mass | | | 33.8 | 33.5 | |
| | Polybutadiene 3 | Parts by mass | | | | | 33.5 |
| Component (b2) | Bismaleimide compound 1 | Parts by mass | 1.21 | | 1.21 | | |
| | Bismaleimide compound 2 | Parts by mass | | 1.89 | | | |
| | Bismaleimide compound 3 | Parts by mass | | | | 1.48 | 1.48 |
| Reaction catalyst | Organic peroxide | Parts by mass | 0.034 | 0.033 | 0.034 | 0.033 | 0.033 |
| Physical properties | Vinyl group modification rate | % | 40 | 50 | 60 | 70 | 40 |

The details of each component described in Table 1 are as follows. [Component (b1)]
Polybutadiene 1: 1,2-polybutadiene homopolymer, number average molecular weight=3,200, vinyl group content=90% or more
Polybutadiene 2: 1,2-polybutadiene homopolymer, number average molecular weight=2,100, vinyl group content=90% or more
Polybutadiene 3: 1,2-polybutadiene homopolymer, number average molecular weight=1,200, vinyl group content=85% or more
[Component (b2)]
Bismaleimide compound 1: 4,4'-diphenylmethane bismaleimide
Bismaleimide compound 2: 2,2-bis[4-(4-maleimidophenoxy)phenyl]propane
Bismaleimide compound 3: 3,3'-dimethyl-5,5'-diethyl-4,4'-diphenylmethane bismaleimide
[Reaction catalyst]
Organic peroxide: α,α'-bis(t-butylperoxy)diisopropylbenzene
[Production of Resin Composition]

Examples 1 to 8 and Comparative Examples 1 to 2

Each component shown in Table 2 was blended with toluene according to the blending amount shown in Table 2, stirred and mixed while heating at 25° C. or 50 to 80° C. to prepare a resin composition having a solid concentration of about 50% by mass. In Table 2, the unit of the blending amount of each component is parts by mass, and in the case of a solution, it means parts by mass in terms of solid content.
[Production of Resin Film and Resin Sheet with Copper Foil on Both Sides]

The resin composition obtained in each example was applied to a PET film with a thickness of 38 μm (a trade name: G2-38, manufactured by Teijin Limited) and then dried by heating at 170° C. for 5 minutes to obtain a B-stage resin film. After peeling the resin film from the PET film, the resin film was pulverized into a B-stage resin powder, which was put into a Teflon (registered trademark) sheet punched into a size of 1 mm (thickness)×50 mm (length)×35 mm (width). Thereafter, a low-profile copper foil having a thickness of 18 μm (a trade name: 3EC-VLP-18, manufactured by Mitsui Mining & Smelting Co., Ltd.) was placed above and below the Teflon (registered trademark) sheet into which the resin powder was put to obtain a laminate before heat-press molding. The low-profile copper foil was placed with an M side facing the resin powder. Subsequently, the laminate was subjected to heat-press molding under conditions of a temperature of 230° C., a pressure of 2.0 MPa, and a time of 120 minutes, and by molding and curing the resin powder into a resin sheet, a resin sheet with copper foil on both sides was produced. The thickness of the resin sheet portion of the obtained resin sheet with copper foil on both sides was 1 mm.

[Evaluation Method and Measurement Method]

Using the resin compositions and the resin sheets with copper foil on both sides obtained in the above Examples and Comparative Examples, each measurement and evaluation was performed according to the following methods. The results are shown in Table 2.

(1. Method of Evaluating Compatibility of Resin Composition)

The resin composition obtained in each example was visually observed and the compatibility was evaluated according to the following criteria.

A: There was no macroscopic phase separation and precipitates even when left for one week or more.

B: When left for one day, macroscopic phase separation or precipitates occurred.

(2. Method of Measuring Minimum Melt Viscosity)

After pulverizing the resin powder obtained in each example with a mortar, about 0.6 g was weighed and formed into a disc-shaped tablet with a diameter of 20 mm using a tablet forming machine. Subsequently, using the tablet as a measurement sample, the minimum melt viscosity was measured using a rheometer (a trade name: ARES-2K STD-FCO-STD, manufactured by Rheometric Co., Ltd.) under conditions of a temperature increase rate of 3° C./min, a load of 0.2 N, and a measurement temperature range of 50 to 200° C.

(3. Method of Measuring Dielectric Constant and Dielectric Loss Tangent)

The resin sheet with copper foil on both sides obtained in each example was immersed in a 10% by mass solution of ammonium persulfate (manufactured by Mitsubishi Gas Chemical Co., Ltd.), which is a copper etching solution, to remove the copper foil and prepare a test piece of 2 mm×50 mm. Thereafter, the dielectric constant (Dk) and dielectric loss tangent (Df) of the test piece were measured at an ambient temperature of 25° C. and in a 10 GHz band according to the cavity resonator perturbation method.

(4. Method of Measuring Coefficient of Thermal Expansion)

The copper foil on both sides of the resin sheet with copper foil on both sides obtained in each example was removed by etching to prepare a test piece of 5 mm square. Thereafter, the coefficient of thermal expansion of the test piece was measured according to the IPC (The Institute for Interconnecting and Packaging Electronic Circuits) standards using a thermomechanical measurement apparatus (TMA) (a trade name: Q400, manufactured by TA Instruments Japan Co., Ltd.). The coefficient of thermal expansion is the coefficient of thermal expansion in the thickness direction of the resin sheet, and was taken as an average coefficient of thermal expansion in a temperature range of 30 to 120° C.

(5. Method of Measuring Peel Strength)

The copper foil of the resin sheet with copper foil on both sides obtained in each example was processed into a straight line with a width of 5 mm by etching, and then dried at 105° C. for 1 hour to obtain a test piece. Thereafter, using a small desktop tester (a trade name: EZ-Test, manufactured by Shimadzu Corporation), the peel strength at the time when the copper foil, which was a straight line of the test piece, was peeled off in a 90° direction at a rate of 50 mm/min was measured according to JIS C6481.

(6. Method of Evaluating Heat Resistance)

The copper foil on both sides of the resin sheet with copper foil on both sides obtained in each example was removed by etching to prepare a test piece of 40 mm×40 mm. Thereafter, the test piece was processed under conditions of 121° C. and 0.11 MPa using a pressure cooker (a trade name: HA-300M, manufactured by Hirayama Seisakusho Co., Ltd.). After the treated test piece was immersed in a bath of molten solder at 288° C. for 20 seconds, the appearance of the test piece was visually observed, and heat resistance was evaluated according to the following criteria.

A: No blistering was observed.

B: Blistering was observed.

TABLE 2

| | | | | Examples | | | | |
|---|---|---|---|---|---|---|---|---|
| | | | | 1 | 2 | 3 | 4 | 5 |
| Blending amount of each component | Component (A) | Component (A1) | Maleimide compound A-1 | 5.0 | | | | |
| | | | Maleimide compound A-2 | | 5.0 | | | |
| | | | Maleimide compound A-3 | | | 5.0 | 10.0 | 5.0 |
| | | Component (A2) | Maleimide compound A-4 | | | | | |
| | | | Maleimide compound A-5 | | | | | 17.2 |
| | | | Maleimide compound A-6 | 17.2 | 17.2 | 17.2 | 12.2 | |
| | Component (B) | Component (B1) | Modified conjugated diene polymer B1-1 | 7.7 | | | | |
| | | | Modified conjugated diene polymer B1-2 | | 7.7 | | | |
| | | | Modified conjugated diene polymer B1-3 | | | 7.7 | | |
| | | | Modified conjugated diene polymer B1-4 | | | | 7.7 | |
| | | | Modified conjugated diene polymer B1-5 | | | | | 7.7 |
| | | | Conjugated diene polymer | | | | | |

TABLE 2-continued

|  |  |  |  |  |  |  |  |  |
|---|---|---|---|---|---|---|---|---|
|  |  | Component (B2) | Styrene-based elastomer B2-1 | 16.1 | 16.1 | 16.1 | 16.1 |  |
|  |  |  | Styrene-based elastomer B2-2 |  |  |  |  | 16.1 |
|  | Component (C) | Spherical silica (average particle size 0.5 μm) |  | 47.5 | 47.5 | 47.5 | 47.5 | 47.5 |
|  | Component (D) | Aluminum tris-diethylphosphinate |  | 5.9 | 5.9 | 5.9 | 5.9 | 5.9 |
|  | Component (E) | Dicumyl peroxide |  | 0.6 | 0.6 | 0.6 | 0.6 | 0.6 |
| Evaluation results | Compatibility |  |  | A | A | A | A | A |
|  | Minimum melt viscosity (mPa · s) |  |  | 3,500 | 4,000 | 3,500 | 3,000 | 3,500 |
|  | Dielectric characteristics | Dielectric constant (Dk) (10 GHz) |  | 2.8 | 2.8 | 2.8 | 2.8 | 2.8 |
|  |  | Dielectric loss tangent (Df) (10 GHz) |  | 0.0021 | 0.0022 | 0.0020 | 0.0023 | 0.0021 |
|  | Coefficient of thermal expansion (ppm/° C.) |  |  | 65 | 65 | 65 | 65 | 63 |
|  | Peel strength (kN/m) |  |  | 0.6 | 0.6 | 0.6 | 0.6 | 0.6 |
|  | Heat resistance |  |  | A | A | A | A | A |

|  |  |  |  | Examples | | | Comparative Examples | |
|---|---|---|---|---|---|---|---|---|
|  |  |  |  | 6 | 7 | 8 | 1 | 2 |
| Blending amount of each component | Component (A) | Component (A1) | Maleimide compound A-1 |  |  |  |  |  |
|  |  |  | Maleimide compound A-2 |  |  |  |  |  |
|  |  |  | Maleimide compound A-3 | 5.0 | 5.0 | 5.0 |  |  |
|  |  | Component (A2) | Maleimide compound A-4 |  |  |  |  |  |
|  |  |  | Maleimide compound A-5 | 17.2 |  |  |  |  |
|  |  |  | Maleimide compound A-6 |  | 17.2 | 17.2 | 22.2 | 30.3 |
|  | Component (B) | Component (B1) | Modified conjugated diene polymer B1-1 |  |  |  |  |  |
|  |  |  | Modified conjugated diene polymer B1-2 |  |  |  |  |  |
|  |  |  | Modified conjugated diene polymer B1-3 |  |  |  |  |  |
|  |  |  | Modified conjugated diene polymer B1-4 |  |  |  |  |  |
|  |  |  | Modified conjugated diene polymer B1-5 | 7.7 | 7.7 |  | 7.7 |  |
|  |  |  | Conjugated diene polymer |  |  | 7.7 |  |  |
|  |  | Component (B2) | Styrene-based elastomer B2-1 |  |  | 16.1 | 16.1 | 16.1 |
|  |  |  | Styrene-based elastomer B2-2 | 16.1 | 16.1 |  |  |  |
|  | Component (C) | Spherical silica (average particle size 0.5 μm) |  | 47.5 | 47.5 | 47.5 | 47.5 | 47.5 |
|  | Component (D) | Aluminum tris-diethylphosphinate |  | 5.9 | 5.9 | 5.9 | 5.9 | 5.9 |
|  | Component (E) | Dicumyl peroxide |  | 0.6 | 0.6 | 0.6 | 0.6 | 0.6 |
| Evaluation results | Compatibility |  |  | A | A | B | A | B |
|  | Minimum melt viscosity (mPa · s) |  |  | 2,500 | 3,000 | 6,000 | 8,000 | 10,000 |
|  | Dielectric characteristics | Dielectric constant (Dk) (10 GHz) |  | 2.7 | 2.8 | 2.8 | 2.8 | 2.8 |
|  |  | Dielectric loss tangent (Df) (10 GHz) |  | 0.0016 | 0.0019 | 0.0021 | 0.0020 | 0.0024 |
|  | Coefficient of thermal expansion (ppm/° C.) |  |  | 123 | 75 | 6 | 65 | 55 |
|  | Peel strength (kN/m) |  |  | 0.6 | 0.6 | 0.6 | 0.6 | 0.6 |
|  | Heat resistance |  |  | B | A | A | A | A |

Each material in Table 2 is as follows.
[Component (A)]
—Component (A1)—
Maleimide compound A-1: 4,4'-diphenylmethanebismaleimide (molecular weight 358.35)
Maleimide compound A-2: 2,2-bis[4-(4-maleimidophenoxy)phenyl]propane (molecular weight 570.60)
Maleimide compound A-3: 3,3'-dimethyl-5,5'-diethyl-4,4'-diphenylmethanebismaleimide (molecular weight 442.51)

—Component (A2)—
Maleimide compound A-4: a maleimide compound having a biphenylaralkyl skeleton (a trade name: "MIR-3000", manufactured by Nippon Kayaku Co., Ltd.,) (molecular weight 725)
Maleimide compound A-5: a maleimide compound having a hydrocarbon group (a trade name: "SFR-2300MR-M", manufactured by Showa Denko Materials Co., Ltd.,) (number average molecular weight 8,000)

Maleimide compound A-6: an aromatic bismaleimide compound containing an indane ring (number average molecular weight 1,200)

[Component (B)]

Modified conjugated diene polymers B1-1 to B1-5: Modified conjugated diene polymers B1-1 to B1-5 obtained in Production Examples 1 to 5

Conjugated diene polymer: 1,2-polybutadiene homopolymer, number average molecular weight=3,200, vinyl group content=90% or more Styrene-based elastomer B2-1: styrene-ethylene-butylene-styrene (SEBS) copolymer, styrene/ethylene-butylene ratio=42/58 (on a mass basis), a trade name "Tuftec H1051", manufactured by Asahi Kasei Corporation Styrene-based elastomer B2-2: styrene-ethylene-butylene-styrene (SEBS) copolymer, styrene/ethylene-butylene ratio=30/70 (on a mass basis), a trade name "Tuftec M1913", manufactured by Asahi Kasei Corporation As is clear from the results shown in Table 2, the resin compositions obtained in Examples 1 to 8 of the present embodiment had reduced minimum melt viscosities. Moreover, the cured products produced using these resin compositions were excellent in heat resistance and low thermal expansion properties, and were excellent in dielectric characteristics in a high frequency band of 10 GHz band.

On the other hand, the resin compositions of Comparative Examples 1 and 2 were insufficient in reducing the minimum melt viscosity.

INDUSTRIAL APPLICABILITY

The resin composition of the present embodiment has a reduced minimum melt viscosity, and the cured product produced from the resin composition has excellent dielectric characteristics in a high frequency band of 10 GHz or higher. Therefore, it is useful for printed wiring boards used in fifth-generation mobile communication system (5G) antennas that use radio waves in the frequency band exceeding 6 GHz and millimeter wave radars that use radio waves in the frequency band of 30 to 300 GHz.

The invention claimed is:

1. A maleimide resin composition comprising
(A) one or more selected from a group consisting of a maleimide compound having one or more N-substituted maleimide groups and a derivative thereof, and
(B) a polymer having a hydrocarbon chain or a polyether chain in a main chain thereof, wherein
the component (A) contains
(A1) a maleimide compound having one or more N-substituted maleimide groups and a molecular weight of less than 600, and
(A2) a maleimide compound having one or more N-substituted maleimide groups and a molecular weight of 600 or more, and
the component (B) is (B1) a modified conjugated diene polymer obtained by modifying (b1) a conjugated diene polymer having a vinyl group in a side chain thereof with (b2) a maleimide compound having two or more N-substituted maleimide groups.

2. The maleimide resin composition according to claim 1, wherein the component (A1) is an aromatic bismaleimide compound.

3. The maleimide resin composition according to claim 1, wherein the component (A2) is a maleimide compound containing an alicyclic hydrocarbon group.

4. The maleimide resin composition according to claim 3, wherein the alicyclic hydrocarbon group is contained as part of an indane ring.

5. The maleimide resin composition according to claim 1, wherein the component (B) is a polymer having a hydrocarbon chain in a main chain thereof.

6. The maleimide resin composition according to claim 1, wherein the component (B1) has, on a side chain thereof, a substituent obtained by reacting the vinyl group of the component (b1) with the N-substituted maleimide group of the component (b2).

7. The maleimide resin composition according to claim 1, wherein the component (b1) is polybutadiene having a 1,2-vinyl group.

8. The maleimide resin composition according to claim 1, wherein a content ratio of the component (A) and the component (B) [(A)/(B)] is 0.3 to 3.0 on a mass basis.

9. A prepreg comprising the maleimide resin composition according to claim 1 or a semi-cured product of the maleimide resin composition.

10. A laminated board comprising a cured product of the maleimide resin composition according to claim 1.

11. A resin film comprising the maleimide resin composition according to claim 1 or a semi-cured product of the maleimide resin composition.

12. A printed wiring board comprising a cured product of the maleimide resin composition according to claim 1.

13. A semiconductor package comprising the printed wiring board according to claim 12 and a semiconductor element.

* * * * *